United States Patent [19]
So et al.

[11] Patent Number: 6,046,078
[45] Date of Patent: Apr. 4, 2000

[54] SEMICONDUCTOR DEVICE FABRICATION WITH REDUCED MASKING STEPS

[75] Inventors: Koon Chong So, San Jose; Fwu-Iuan Hshieh, Saratoga, both of Calif.

[73] Assignee: MegaMOS Corp., San Jose, Calif.

[21] Appl. No.: 08/840,350

[22] Filed: Apr. 28, 1997

[51] Int. Cl.[7] .................................................. H01L 21/336
[52] U.S. Cl. ........................ 438/199; 438/138; 438/268; 438/270; 438/530
[58] Field of Search ................................ 438/199, 268, 438/269, 270, 271, 272, 273, 274, 589, 138, FOR 176, FOR 192, 530; 148/DIG. 126; 257/341, 342, 332

[56] References Cited

U.S. PATENT DOCUMENTS

| | | | |
|---|---|---|---|
| 5,171,699 | 12/1992 | Hutter et al. ............................. | 438/268 |
| 5,194,394 | 3/1993 | Terashima ..................... | 148/DIG. 126 |
| 5,340,756 | 8/1994 | Nagayasu ................................ | 438/200 |
| 5,387,528 | 2/1995 | Hutchings et al. ............ | 148/DIG. 126 |
| 5,404,040 | 4/1995 | Hshieh et al. ........................... | 438/268 |
| 5,656,520 | 8/1997 | Watanabe ................................ | 438/305 |
| 5,668,026 | 9/1997 | Lin et al. ................................ | 438/272 |

*Primary Examiner*—Michael Trinh
*Attorney, Agent, or Firm*—Kam T. Tam

[57] ABSTRACT

A method of forming a power MOSFET (Metal Oxide Semiconductor Field Effect Transistor) device on a semiconductor substrate with reduced masking steps is disclosed. In the first method, the reduced masking steps are arranged in an optimal sequence in which the gate layer is patterned first as a self-aligned mask. The gate layer includes a plurality of gate segments separated by spacings. An active mask for defining active body regions is then patterned in the spacings of the gate layer to form a combination mask. Using the combination mask as a shield, body and source regions are ion-implanted into the substrate. During the formation of the active mask, remnant material of the active mask adheres to the boundaries of the gate segments to form a spacer layer which is utilized to alleviate the cell-to-cell encroachment problem due to the side diffusion effect of the body and source regions. In the second method, trenched gates are formed first on the semiconductor substrate prior to the patterning of the active mask which is used to perform multiple duties of defining the source and body diffusions, and the delineation of the active circuit region from the termination circuit region of the MOSFET device.

12 Claims, 20 Drawing Sheets

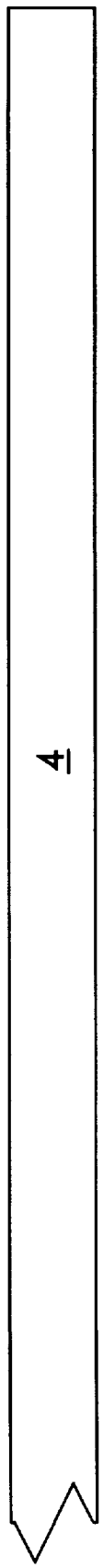
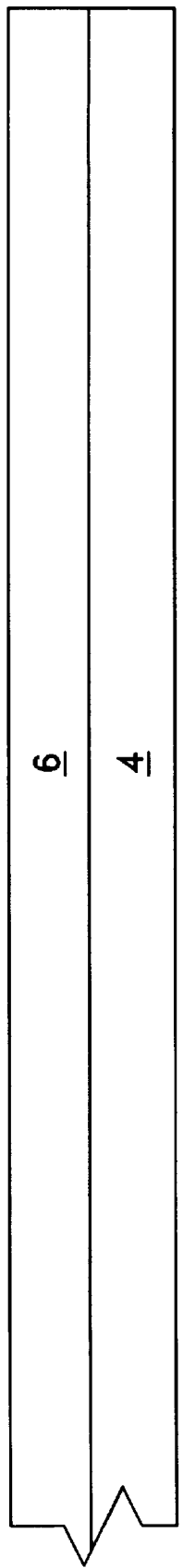
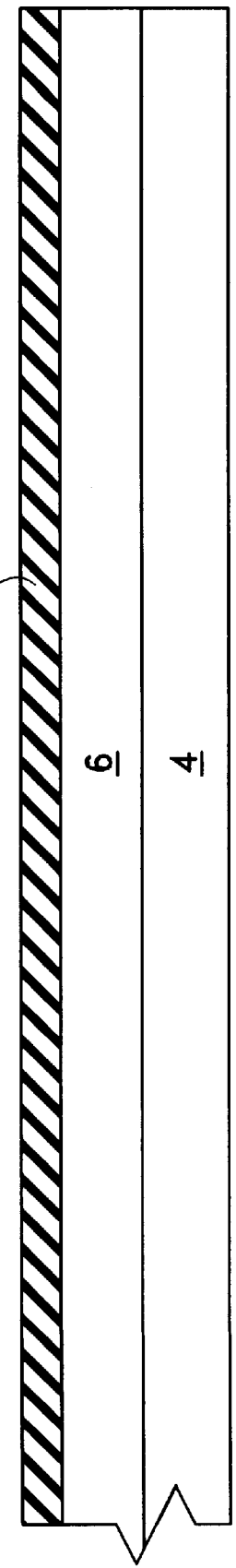
FIG. 1A (PRIOR ART)
FIG. 1B (PRIOR ART)
FIG. 1C (PRIOR ART)

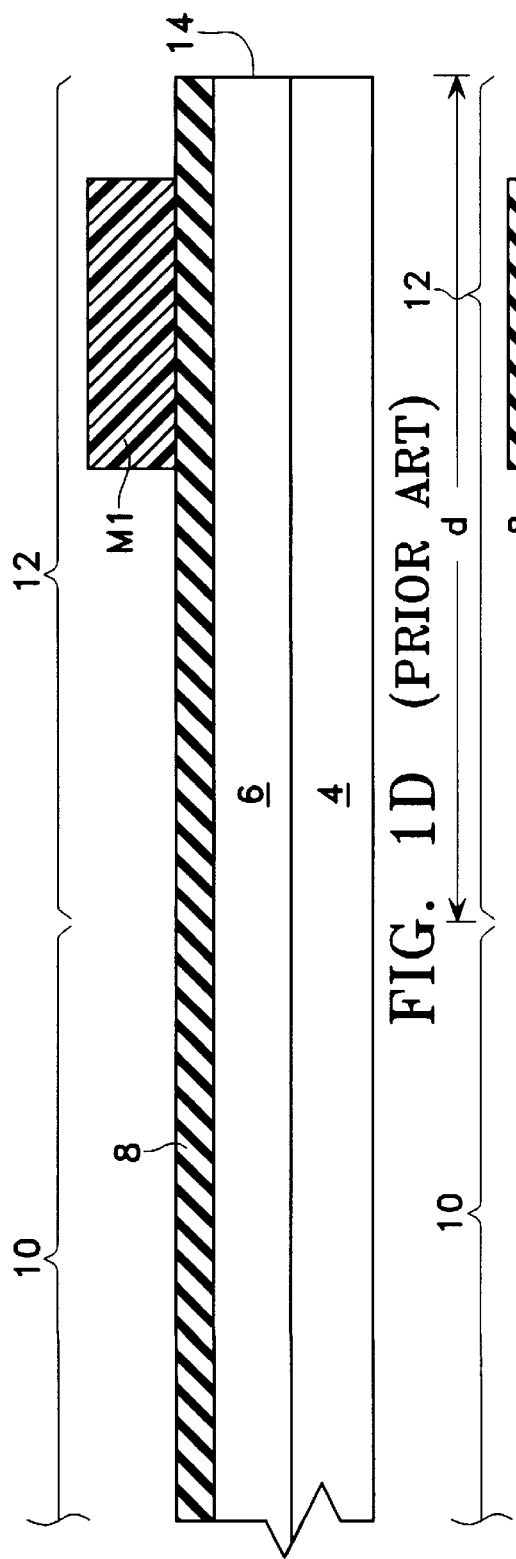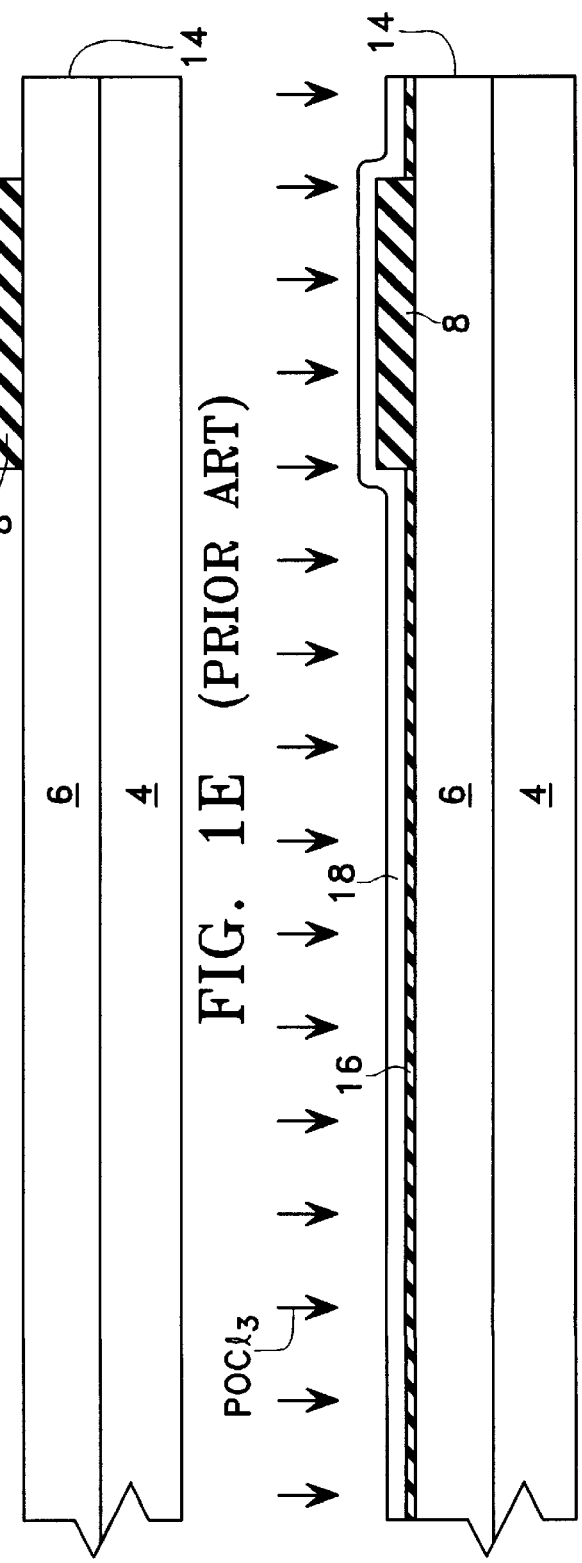

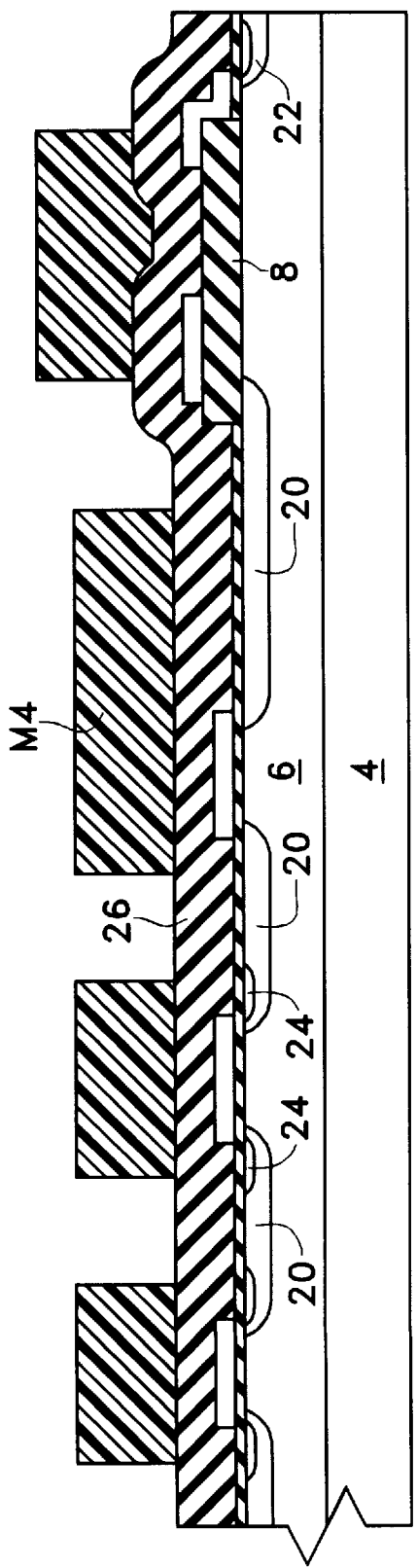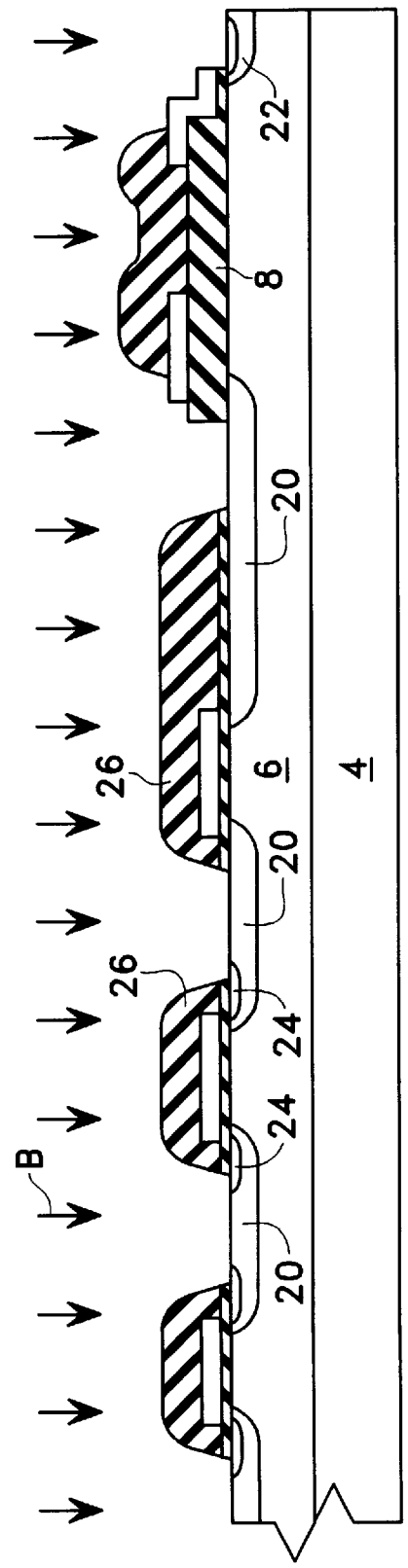
FIG. 1M (PRIOR ART)
FIG. 1N (PRIOR ART)

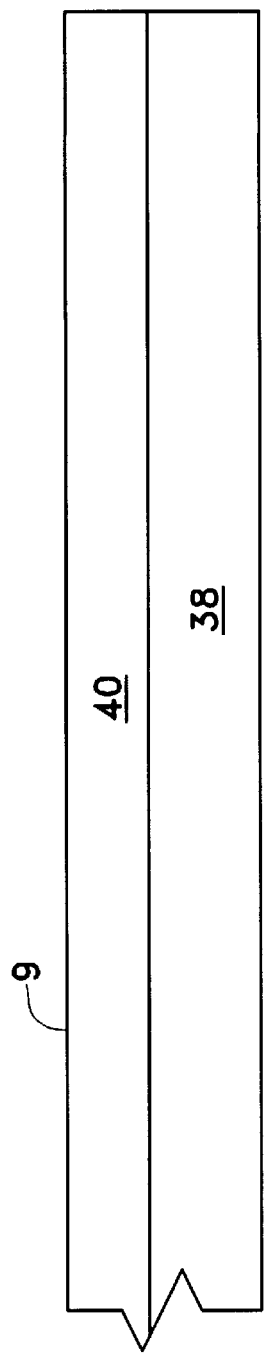
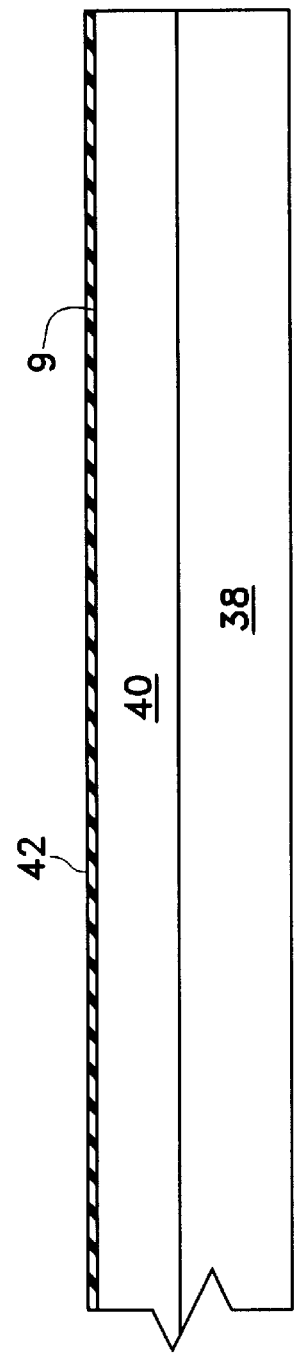
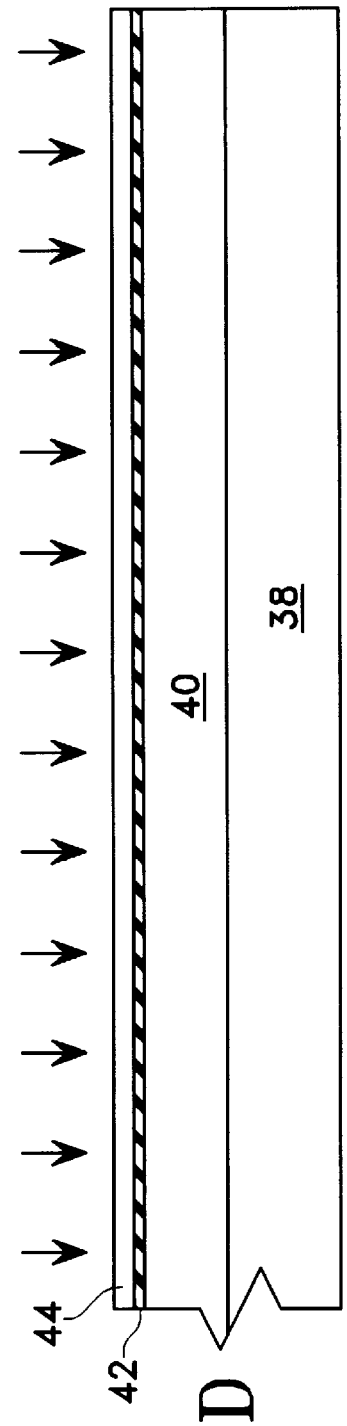
FIG. 3A
FIG. 3B
FIG. 3C
FIG. 3D

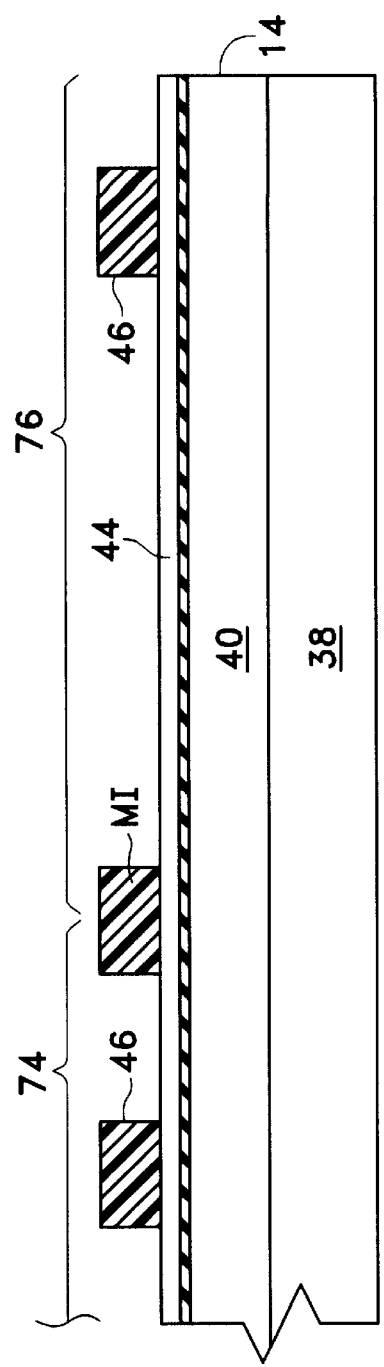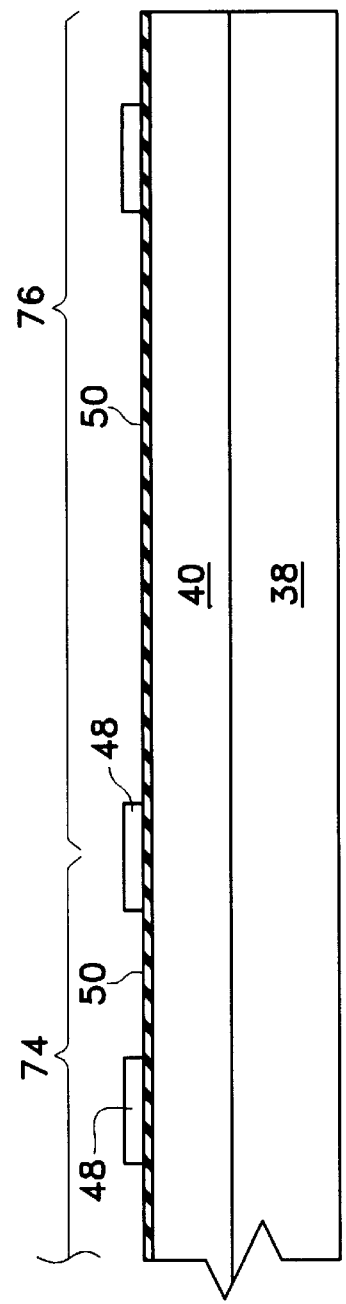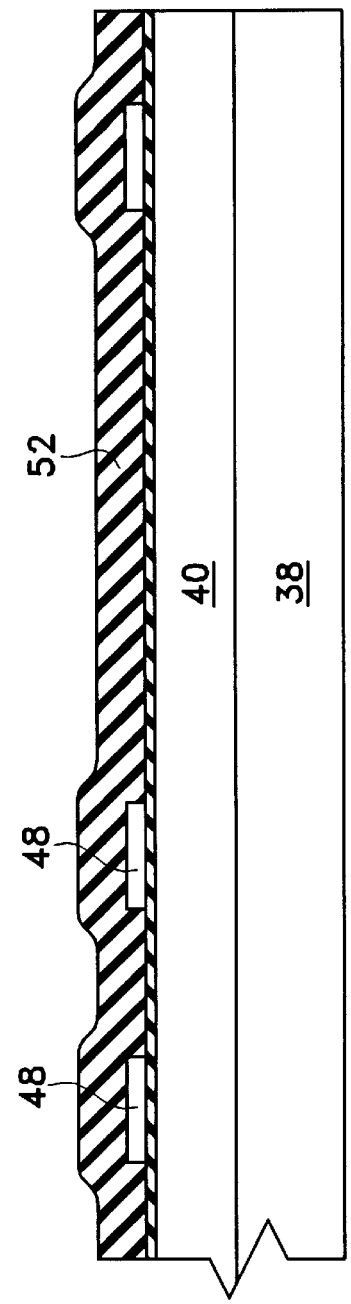

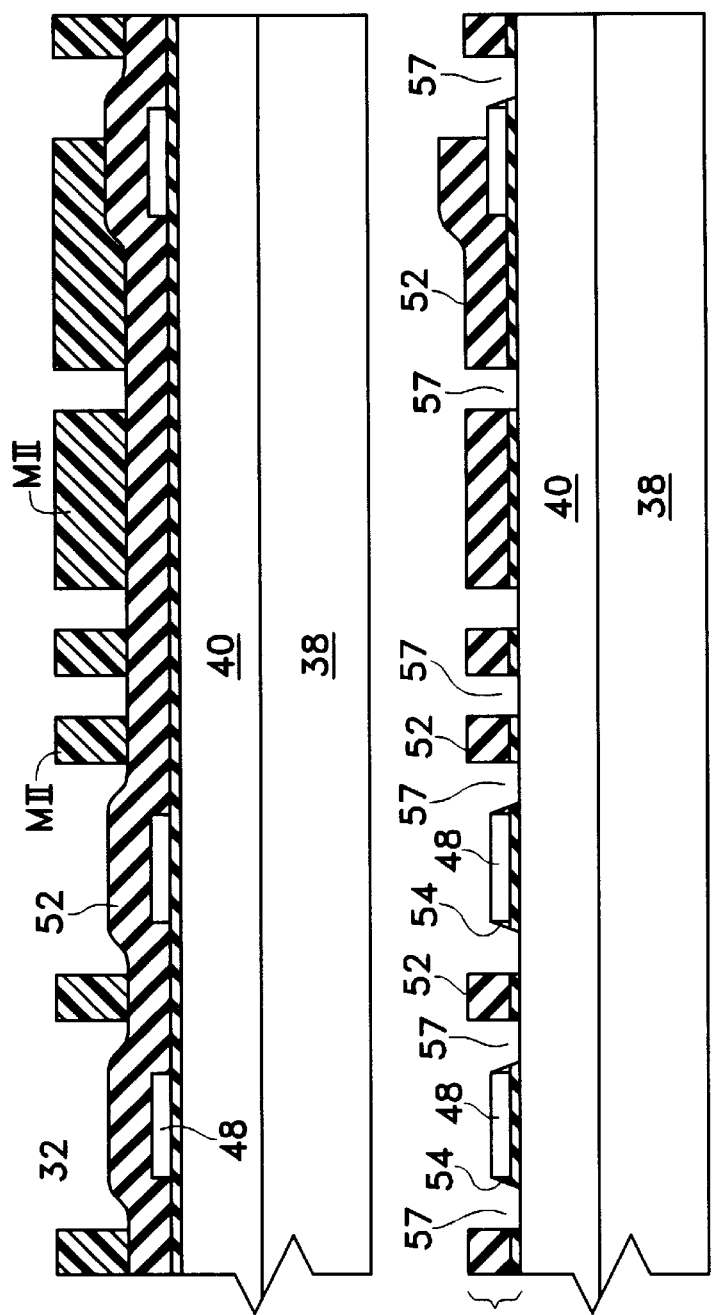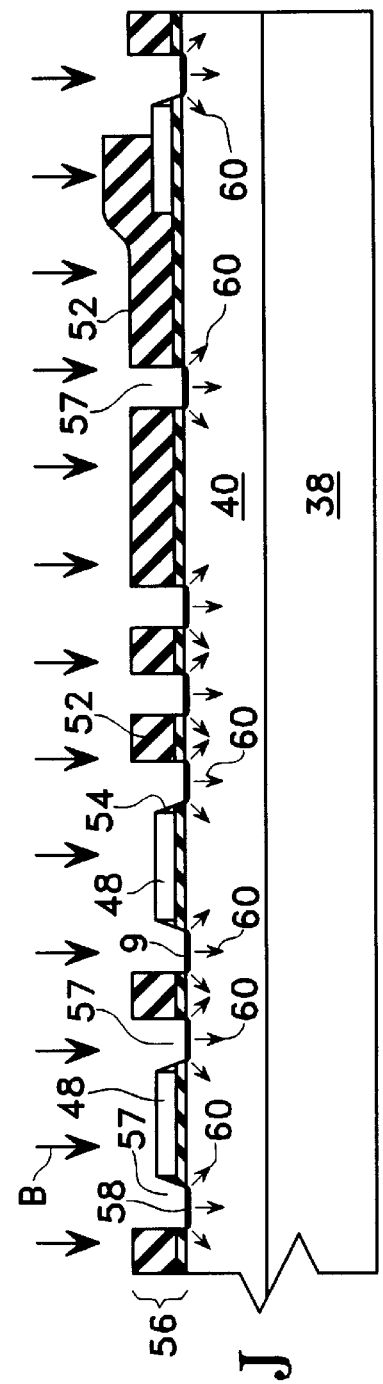
FIG. 3H
FIG. 3I
FIG. 3J

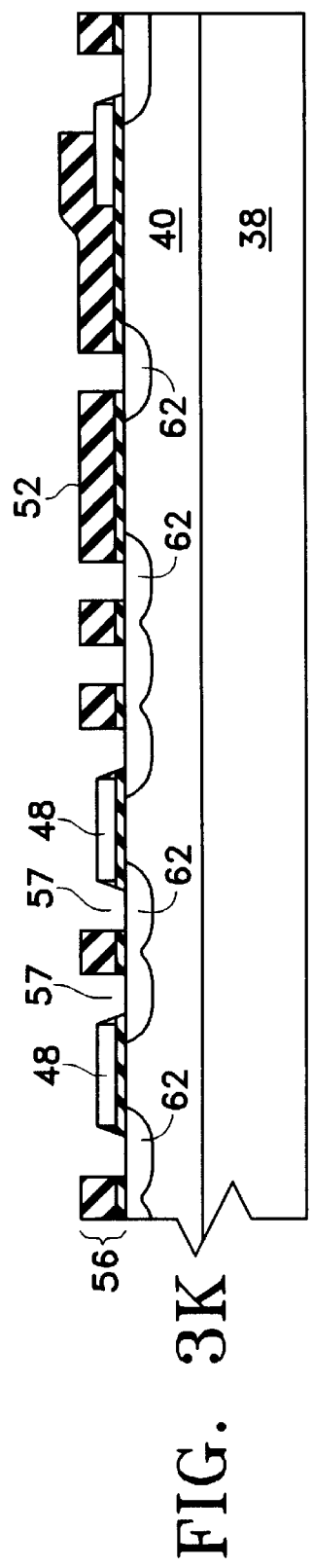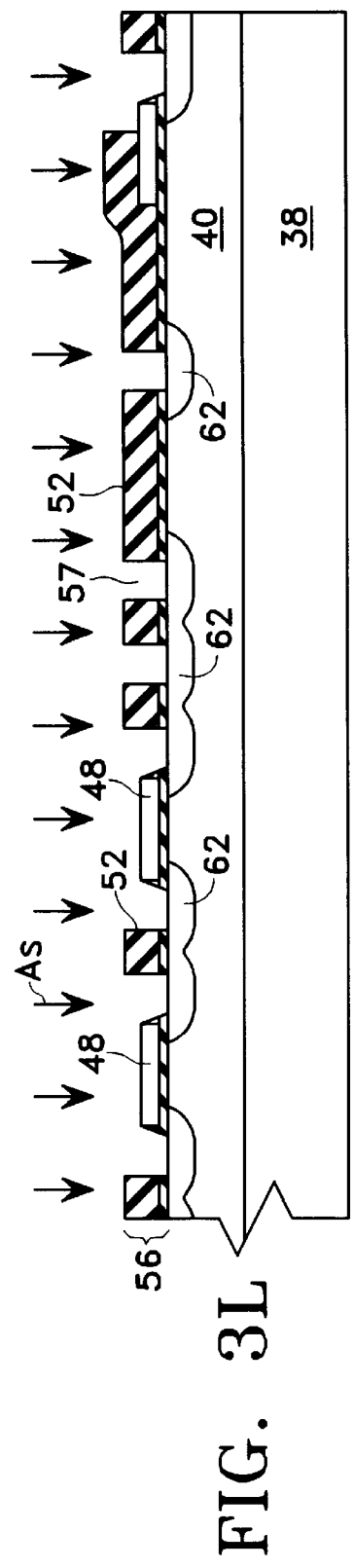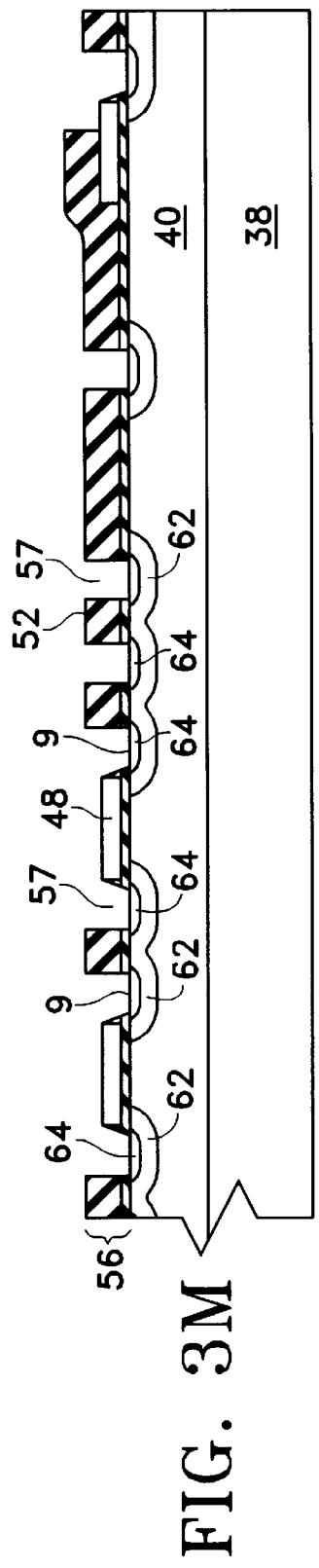

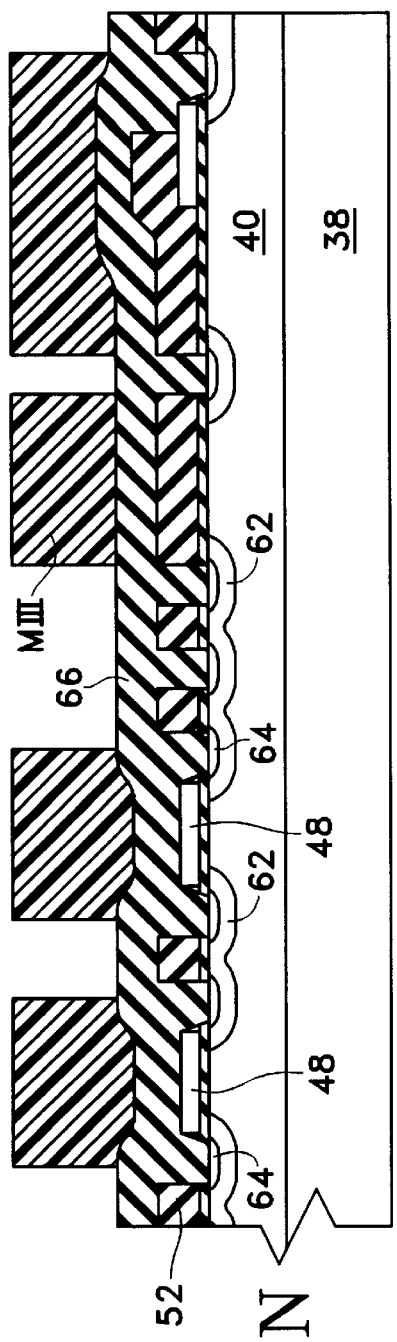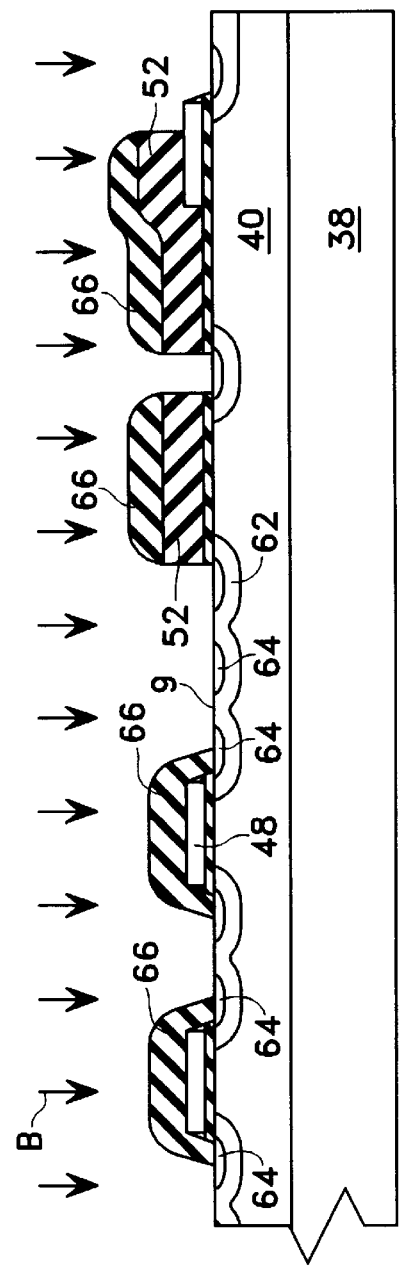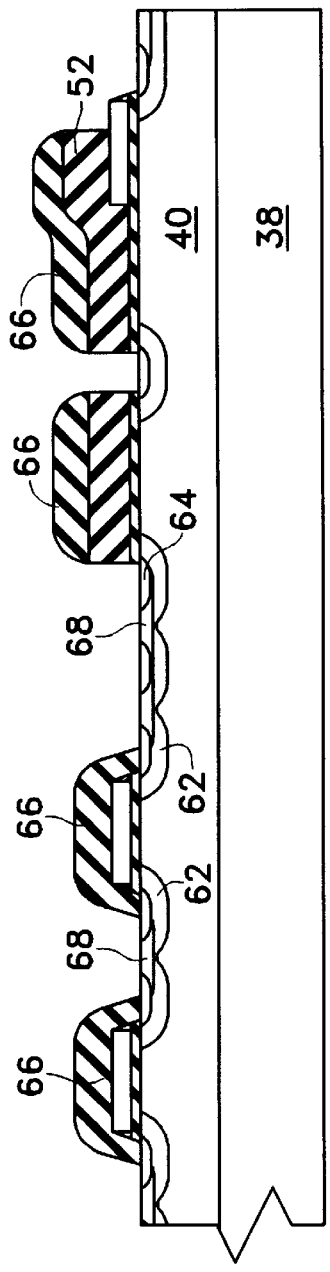

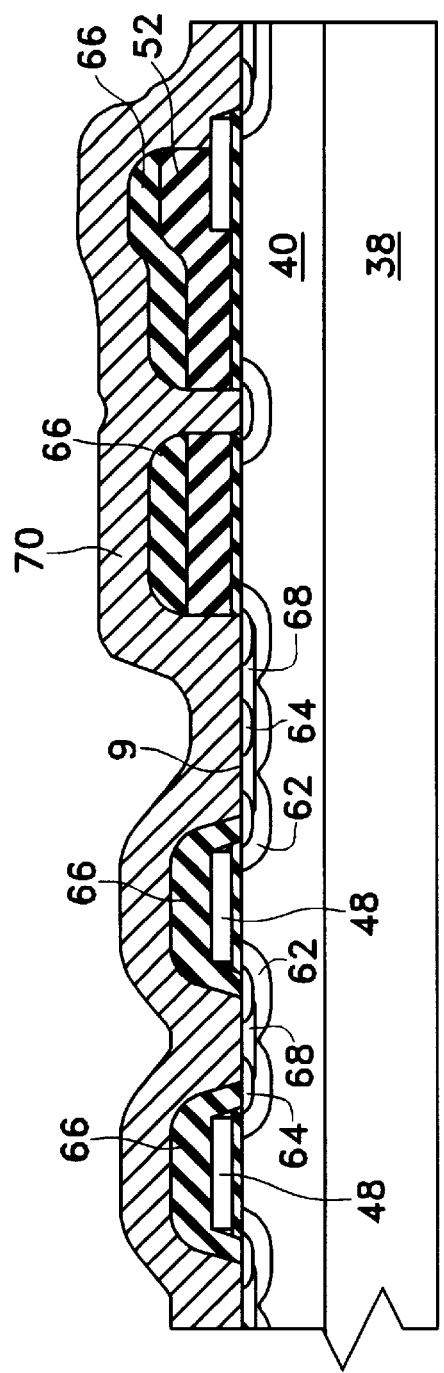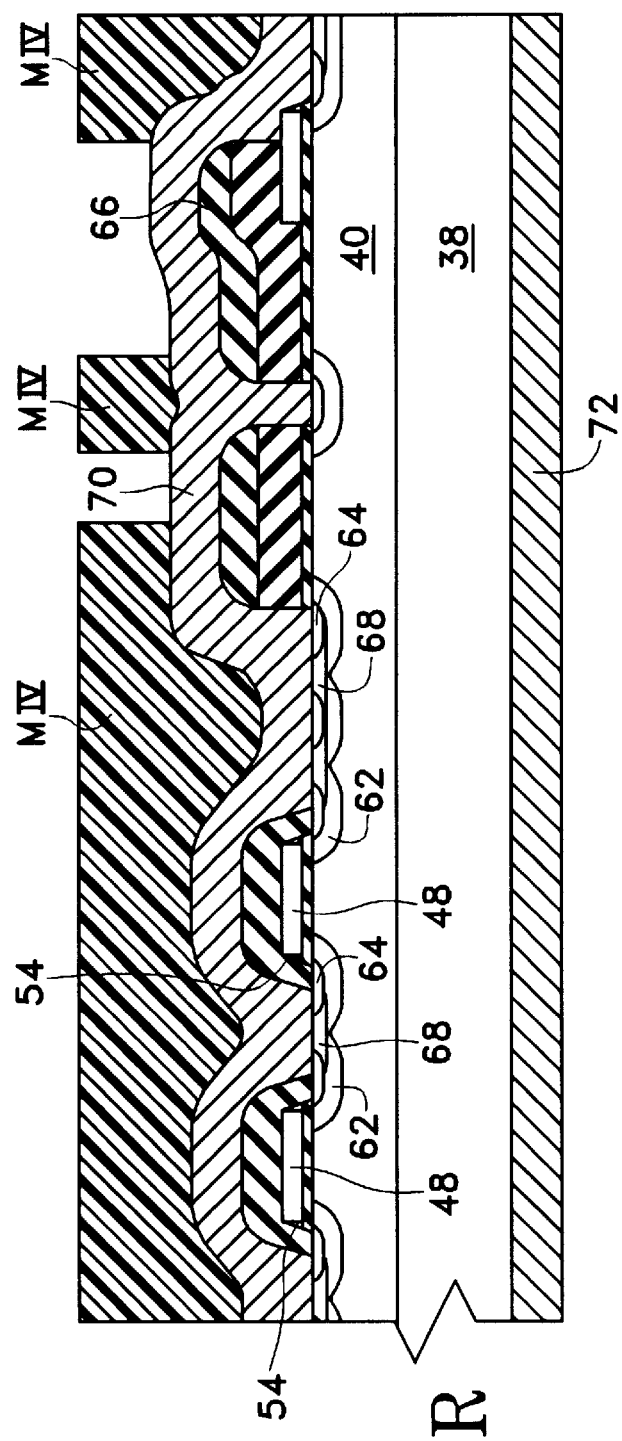
FIG. 3Q
FIG. 3R

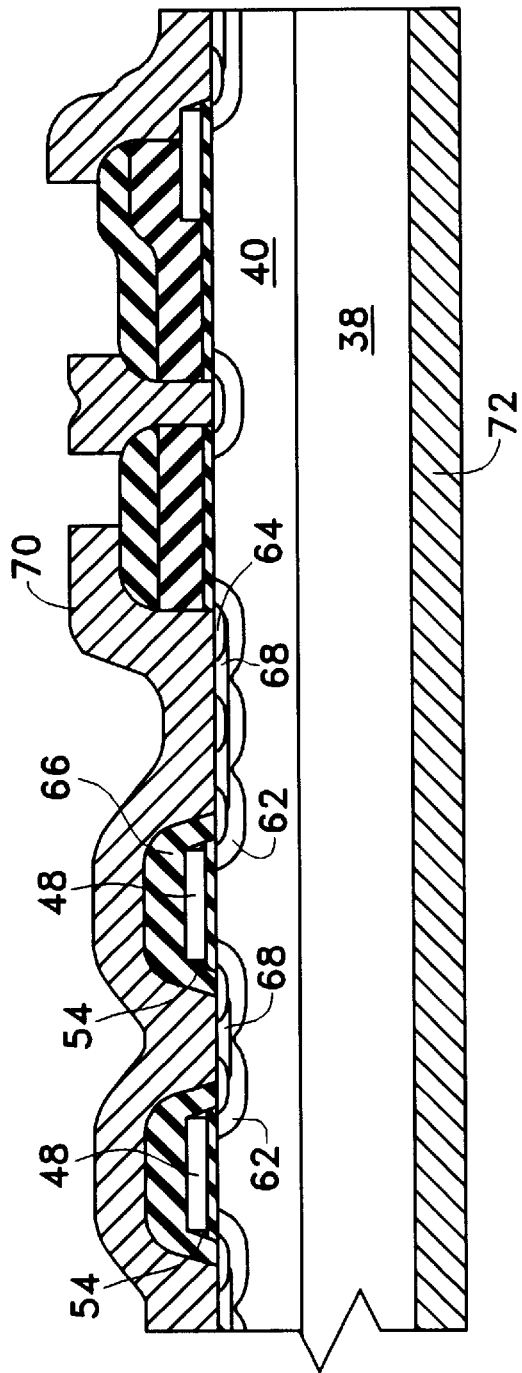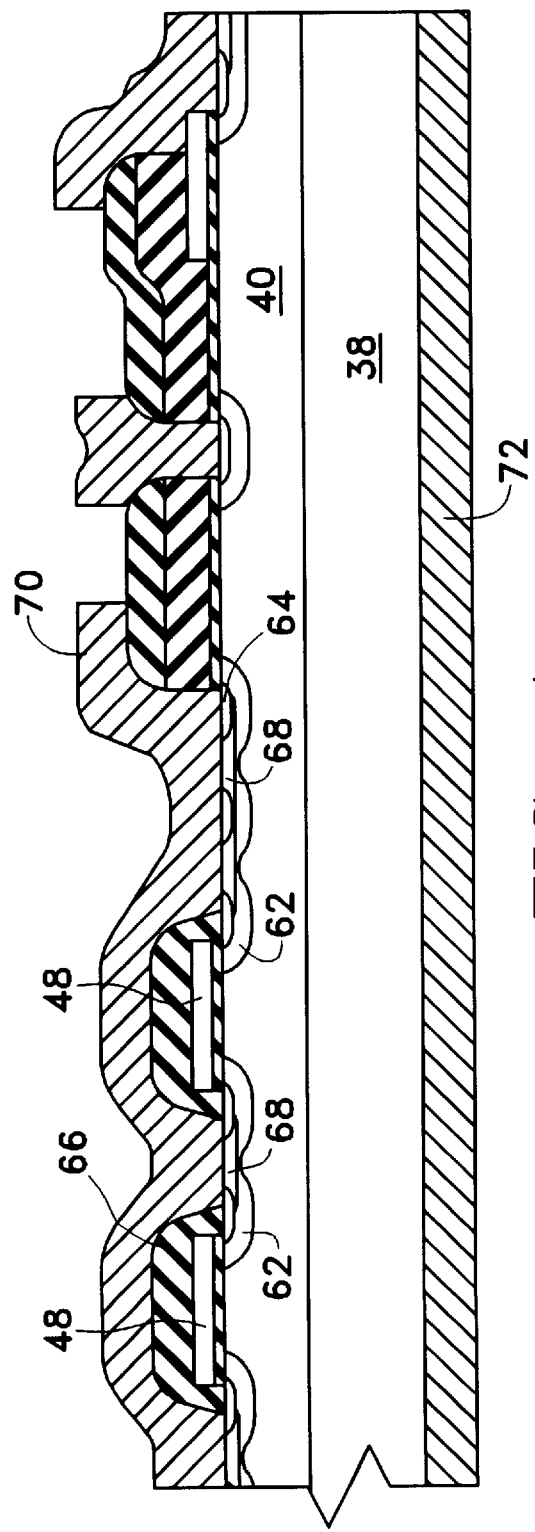

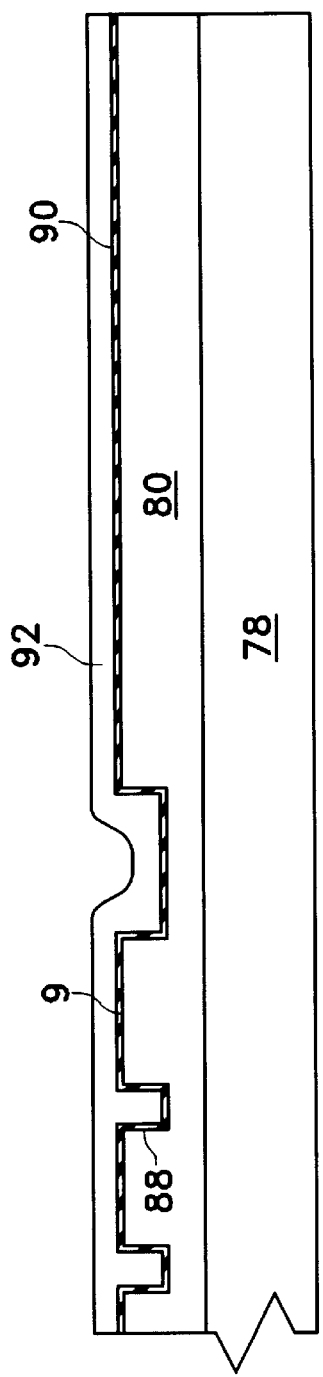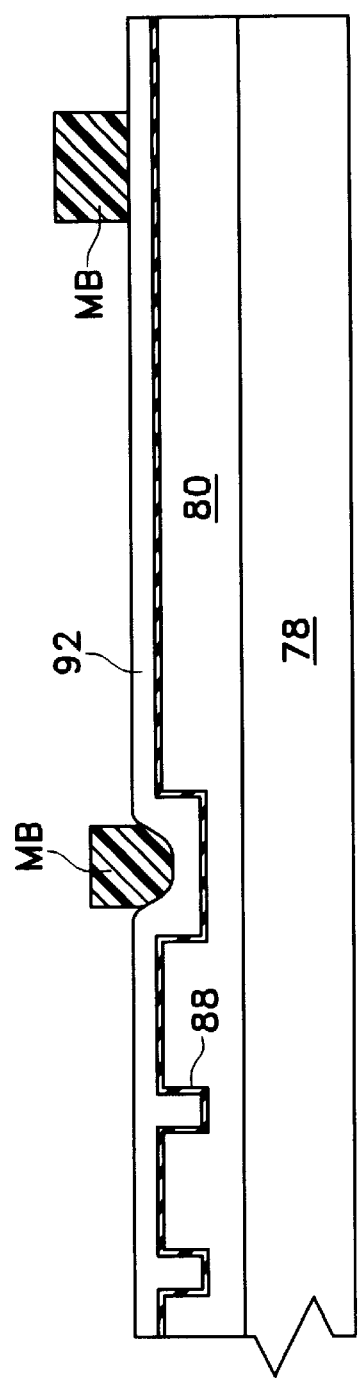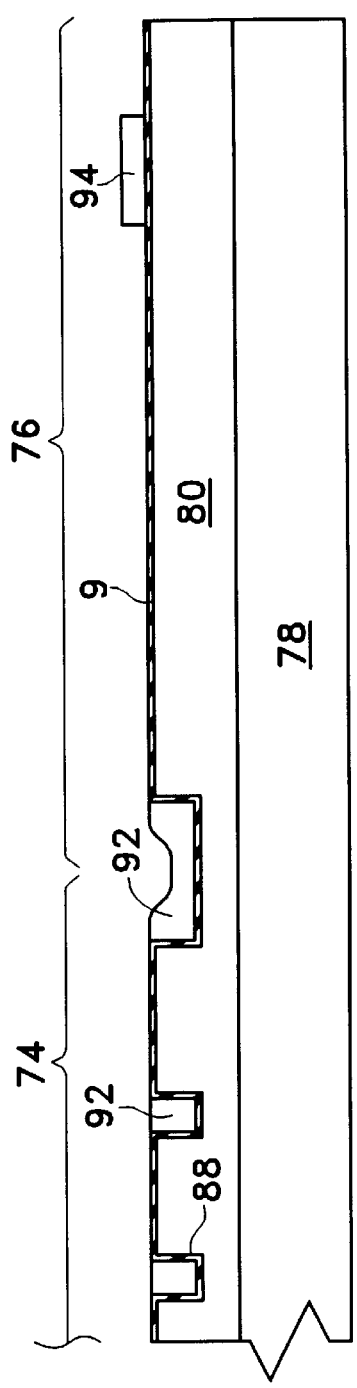

SEMICONDUCTOR DEVICE FABRICATION WITH REDUCED MASKING STEPS

CROSS-REFERENCE TO COPENDING APPLICATION

U.S. patent application Ser. No. 08/611,745 filed Mar. 25, 1996, U.S. Pat. No. 5,668,026, on behalf of Koon Chong So, and assigned to the same assignee, discloses a semiconductor fabrication process with reduced number of masking steps. The subject matter of the copending application is incorporated herein by reference. The present invention is directed to an improved method of forming semiconductor structures with reduced masking steps arranged in an optimal sequence.

BACKGROUND OF THE INVENTION

1. Field of the Invention

The present invention relates generally to microelectronic circuits, and more particularly, to MOSFETs (Metal Oxide Semiconductor Field Effect Transistor) power devices formed by processes with reduced masking steps arranged in optimal sequences.

2. Description of the Related Art

Power semiconductor devices have long been used as replacement for mechanical relays in various applications. Advent in semiconductor technology enables these power devices to operate with high reliability and performance. Modern day instruments, such as fast switching power supplies and high-frequency ballasts, now built at a miniaturized scale, all require the use of power devices with low power consumption and high reliability. Heretofore, fabricating of these power devices have involved a substantial number of manufacturing steps. To highlight the number of masks and the associated steps involved, FIGS. 1A–1R schematically illustrate the conventional process required to fabricate a planar power MOSFET device.

The fabrication process starts with providing a n-type base silicon wafer 4 as shown in FIG. 1A. An epitaxial layer 6 with a predetermined resistivity is then grown atop the base wafer 4 as shown in FIG. 1B. A field oxide layer 8 is thereafter deposited on the top of the epitaxial layer 6. The resultant structure up to this step is shown in FIG. 1C.

A first mask M1, called the active mask, which defines the active circuit area 10 and the termination circuit area 12 is then disposed atop the oxide layer 8 as shown in FIG. 1D. The active mask M1 is a photoresist layer capable of being patterned by the conventional photolithographic process. After proper patterning, using the patterned first mask M1 as a shield, an etching method is employed to define the field oxide layer 8 as shown in FIG. 1D. The field oxide layer 8 delineates the active circuit region 10 away from the scribe line 14 at a distance d as shown in FIG. 1E. The scribe line 14 is a physical cut line separating the semiconductor dies in a finished wafer. The presence of the terminal circuit region 12 buffering the active circuit region 10 from the scribe line 14 is crucial.

In the design of a field-effect transistor, the active circuit region, such as the region 10 shown in FIGS. 1D–1E should never reach the scribe line 14. The crystal structure at the interior portions of the wafer 4, and the subsequent layers built thereon, are normally orderly in nature. However, the same cannot be said of the vicinities adjacent to the scribe line 14, which are usually crowded with sites of highly energetic dangling bondings with unpredictable energy states. No active devices should be built at these sites with the highly unstable characteristics. If active transistor cells are fabricated at these sites, the transistors possibly would be riddled with intolerable leakage current. Worst of all, these sites are normally triggering locations for avalanche breakdown. For these reasons, during the ion implantation process, the patterned field oxide layer 8 (FIG. 1E) provides a layer break which prevents the active circuit region 10 from reaching the scribe line 14. The formation of the field oxide layer 8 necessitates laying of the mask M1 (FIG. 1D) with the associated masking and patterning steps. The method of the present invention provides, inter alia, a novel approach in which the masking and patterning steps associated with the mask M1 are absorbed into other steps.

Reference is now directed back to FIG. 1E. After the removal of the masking layer M1, a layer of thermally grown gate oxide 16 is then grown on the top of the epitaxial layer 6. Thereafter a layer of polysilicon 18 is laid atop the gate oxide layer 16. The resultant structure up to this step is shown in FIG. 1F.

The polysilicon layer 18 needs to be patterned. A second mask M2, called the gate mask, is patterned on the top of the polysilicon layer 18 as shown in FIG. 1G. Using M2 as a shield, the polysilicon layer 18 is etched resulting in a pattern of gate layer 18 above the substrate 4. After the removal of the masking layer M2, the resultant structure is as shown in FIG. 1H.

The method of ion implantation is then employed to form the active body layer 20, and the termination body layer 22. After a proper drive-in process, the active body layer 20 and the terminal body layer 22 are diffused sufficiently deep into the epitaxial layer 6. The resultant structure up to this step is shown in FIG. 1I.

Another layer of photoresist mask M3, called the source mask, is then patterned above the substrate 4 as shown in FIG. 1J. The structure is subject to another step of ion implantation in which the source regions 24 are formed inside the body regions 20 as shown in FIG. 1K.

What follows is the deposition of a layer of phosphosilicate glass (PSG) 26 above the substrate 4 as shown in FIG. 1L. A fourth mask M4, called the contact mask, is patterned atop the PSG layer 26 as shown in FIG. 1M. After proper etching and removal of the photoresist mask M4, the resultant structure up to this step is shown in FIG. 1N.

P-type material, such as boron, is then implanted and diffused into the structure through the patterned PSG layer 26, resulting in contact diffusion layers 28 formed in the body regions 20 as shown in FIG. 1O.

The step of metallization follows. A metal layer 30 is deposited atop the structure by the sputtering process as shown in FIG. 1P. A fifth photoresist mask M5, called the metal mask, is then deposited and patterned on the top of the metal layer 30 as shown in FIG. 1Q. The metal layer 30 is thereafter etched through the mask M5. Furthermore, a drain metal layer 32 is deposited on the bottom side of the wafer 4. The resultant structure up to this step is as shown in FIG. 1R.

Not shown in FIGS. 1A–1R is the deposition of another masking step via a sixth mask M6, called the bonding pad mask, for the purpose of exposing selected areas of the metal layer 30 to the bonding wires, after a protective insulating layer (not shown) is deposited atop the metal layer 30.

In the process of fabricating a MOSFET device as depicted above, there are at least 6 photoresist masks, namely, M1–M6 involved. As with other thin-film microelectronic processes, it is always highly desirable to reduce the number of masks with the associated masking and patterning steps. The advantage of reducing the number of masks in the fabrication process is twofold. First, laying a mask on a semiconductor structure in the manufacturing process is relatively expensive, not merely in the cost of the mask itself but rather in the costs of the various patterning and etching steps associated with the mask. Secondly, the more the number of masking and etching steps are involved, the higher is the chance of contamination during fabrication, and consequently lowers the production yield of the final products. Accordingly, the costs saved by reducing a mask in the fabrication process is beyond the prorated basis of simply reducing a mask.

The advent of high resolution photolithography allows semiconductor components to be formed on a semiconductor substrate with ultra fine geometries. As with other semiconductor devices, the trend in fabrication of power MOSFET devices is toward dense integration. The rationale behind the trend is that the denser the integration, the higher is the number of MOSFET cells operating in parallel and consequently lowers the overall the on-state drain-to-source resistance $R_{DS}$. Lower drain-to-source resistance $R_{DS}$ provides the advantages of lower power dissipation and higher frequency response. However, theoretical feasible as it appears, there are technical complications associated with densely integrating a planar MOSFET array.

Reference is now directed to FIG. 2 which shows the countervailing effects of densely integrating a planar MOSFET device. As mentioned before, advanced development in high definition photolithography allows higher device integration. As integration density increases, cell-to-cell separations decrease. As shown in FIG. 2, the $R_{DS}$ of each cell during the on-state can be approximated by the following algebraic equation:

$$R_{DS}=R_s+R_{ch}+R_j+R_{d1}+R_{d2} \quad (1)$$

where $R_S$, $R_{ch}$, $R_j$, $R_{d1}$ and $R_{d2}$ are the source resistance, the channel resistance, the junction resistance, the drain resistance at the epitaxial region 6, and the drain resistance at the drain contact region 4, respectively, in ohms. The dominant components are the junction resistance $R_j$ and the drain resistance at the epitaxial region $R_{d1}$. First, the epitaxial layer 6 is lightly doped and consequently assumes a high resistivity. Moreover, the epitaxial region 6 is a relatively thick layer and therefore extends a longer resistive path. As integration density increases, the diffusion regions, such as the source diffusions 24 and the body diffusions 20 among the MOSFET cells encroach closer and closer toward each other as illustrated by the directions 21 in FIG. 2. As a consequence, during the device-on state, the drain-to-source current $I_{DS}$ of each cell only has a limited resistive area to pass through. As shown in FIG. 2, basically, the region signified by the reference numeral 34 has to be shared by two cells, namely, MOSFET cell 36 and MOSFET cell 37. As is well known in the art, the smaller the area of the resistive path, the higher is the resistance value. Equally as detrimental is the current crowding effect in the confined region 34 which also plays a dominant role in increasing $R_j$ and $R_{d1}$. Accordingly, the advantage gained in pursuing higher density integration can be totally negated by the increase in drain and junction resistances $R_{d1}$ and $R_j$ as explained above.

As with any manufacturing processes, in the production of semiconductor devices, the twin goals of high performance and low production costs are always earnestly sought. Very often, satisfying one goal means sacrificing the other. It has been a long-felt need to provide semiconductor manufacturing processes that can simultaneously meet the two goals.

SUMMARY OF THE INVENTION

It is the object of the invention to provide MOSFET devices built by a manufacturing process with reduced manufacturing steps, thereby providing higher production yield, and consequently lower manufacturing costs. It is a further object of the invention to provide MOSFET devices with reduced manufacturing steps not at the sacrifice of device performance, on the contrary, the inventive method yields MOSFET devices with improved performance.

The present invention meets the foregoing objectives by providing a novel method of fabricating a MOSFET device, which method includes, inter alia, reduced number of masking steps which are arranged in an optimal sequence. In the first method, the gate layer is first patterned as a self-aligned mask. The gate layer includes a plurality of gate segments separated by spacings. An active mask for defining active body regions is then patterned in the spacings of the gate layer to form a combination mask. During the formation of the active mask, remnant material of the active mask adheres to the boundaries of the gate segments to form a spacer layer. Using the combination mask and the spacer layer as a shield, body and source regions are ion-implanted into the substrate. The spacer layer substantially alleviates the cell-to-cell encroachment problem caused by the side diffusion effect of the subsequently deposited layers. In the second method, trenched gates are formed first on the semiconductor substrate prior to the patterning of the active mask which is used to perform multiple functions of defining subsequent diffusion regions, and the delineation of the active circuit region away from the termination circuit region.

These and other features and advantages of the invention will be apparent to those skilled in the art from the following detailed description, taken together with the accompanying drawings, in which like reference numerals refer to like parts.

DESCRIPTION OF THE DRAWINGS

FIGS. 3A–3S, are sequential views schematically illustrating the first method of fabricating a planar MOSFET structure of the invention;

FIG. 4 is a cross-sectional side view of an alternative embodiment fabricated from the method shown in FIGS. 3A–3S but with a modified etching step;

DETAILED DESCRIPTION OF THE INVENTION

Figure 1G:
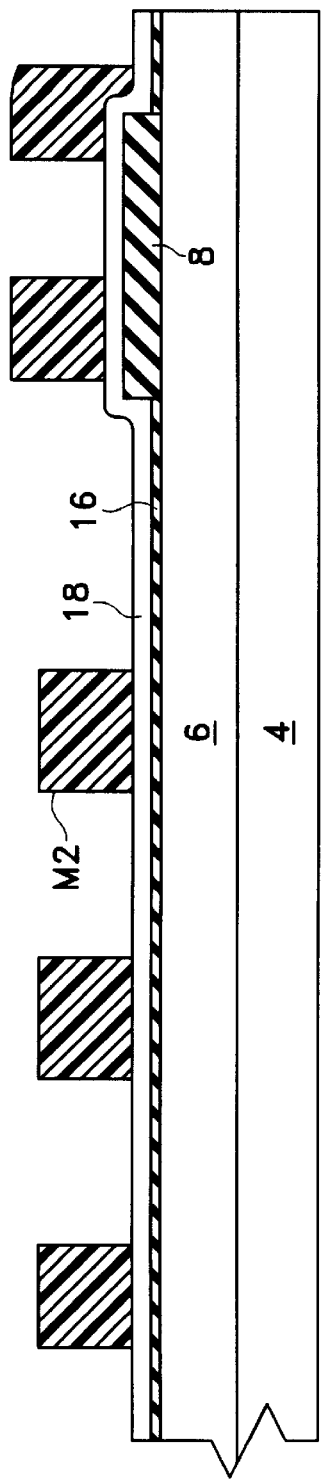
FIGS. 1A–1R, as described above, are sequential views schematically illustrating the conventional method of fabricating a planar MOSFET structure.
Figure 1H:
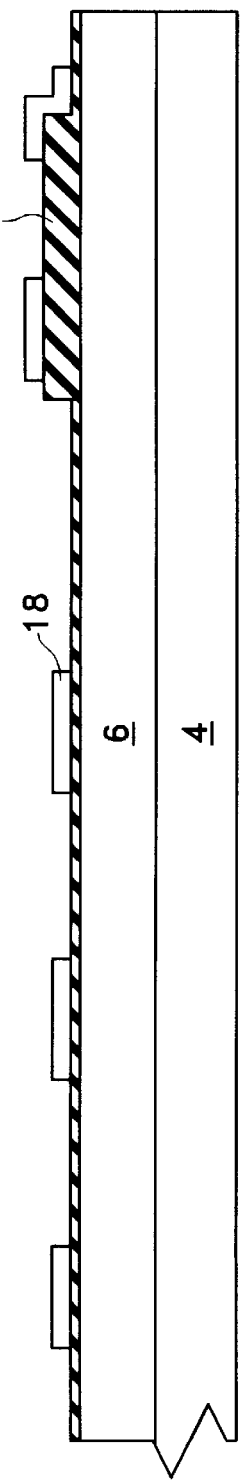
Figure 1I:
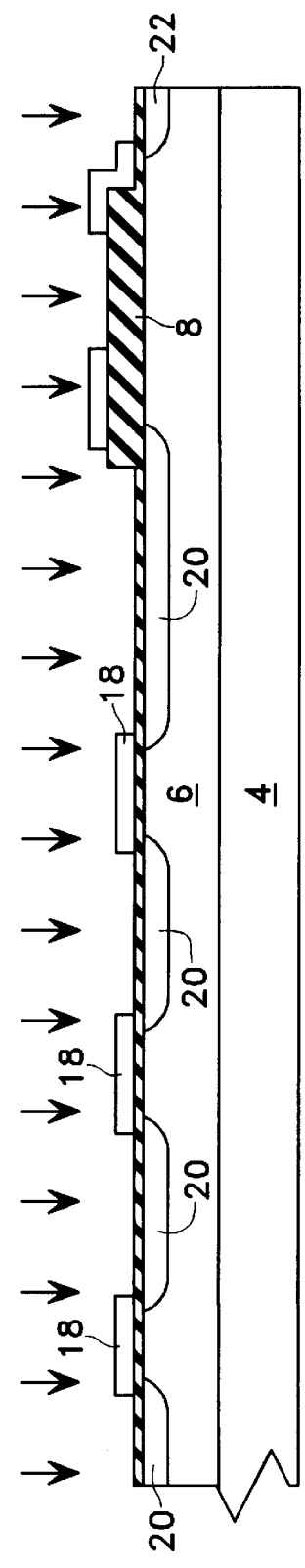
Figure 1J:
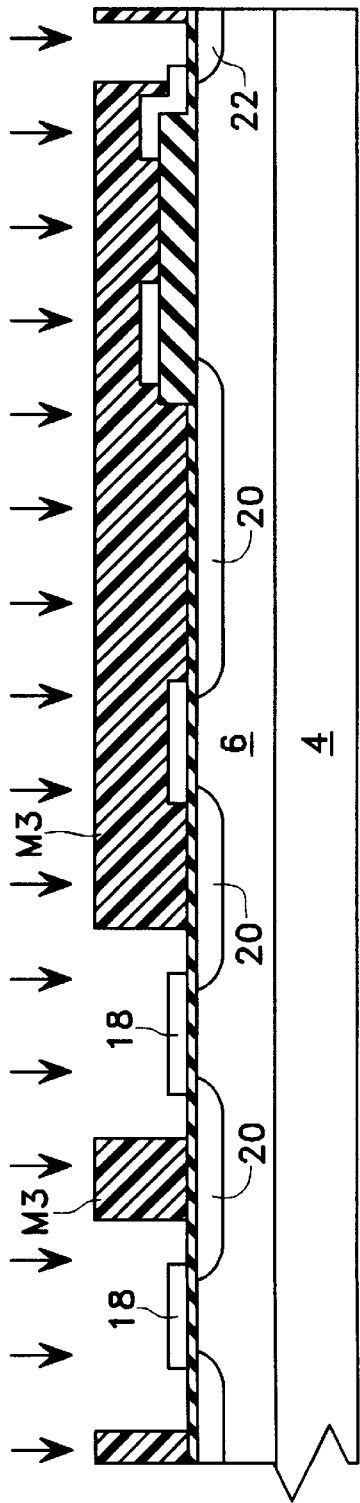
Figure 1K:
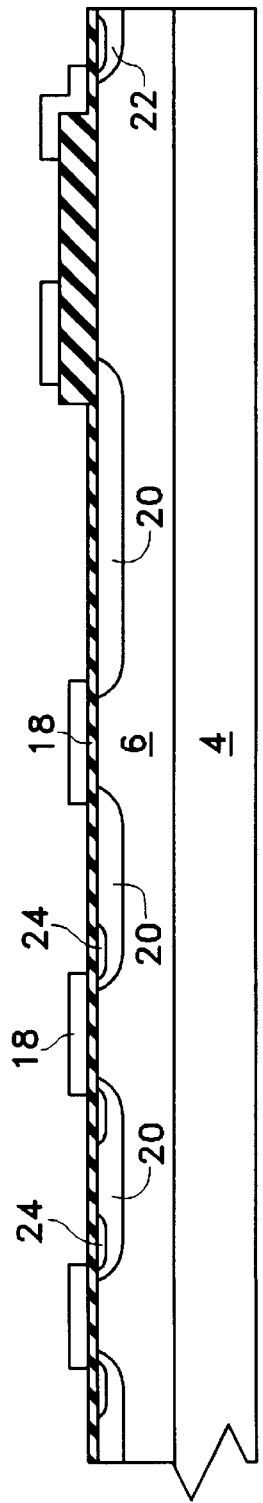
Figure 1L:
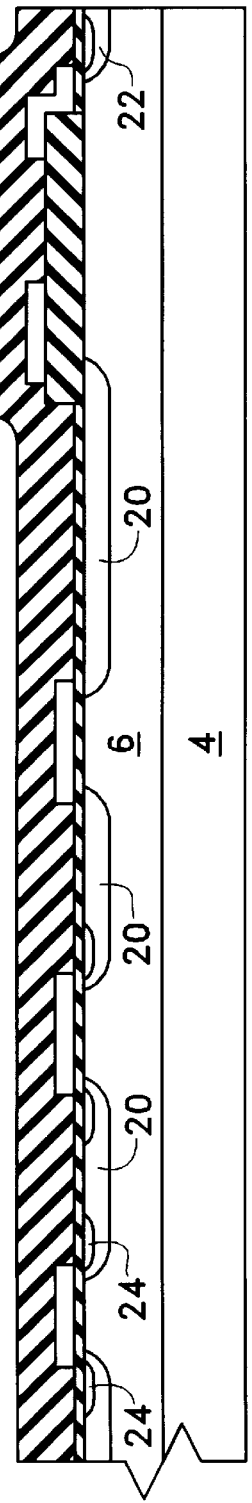
Figure 1O:
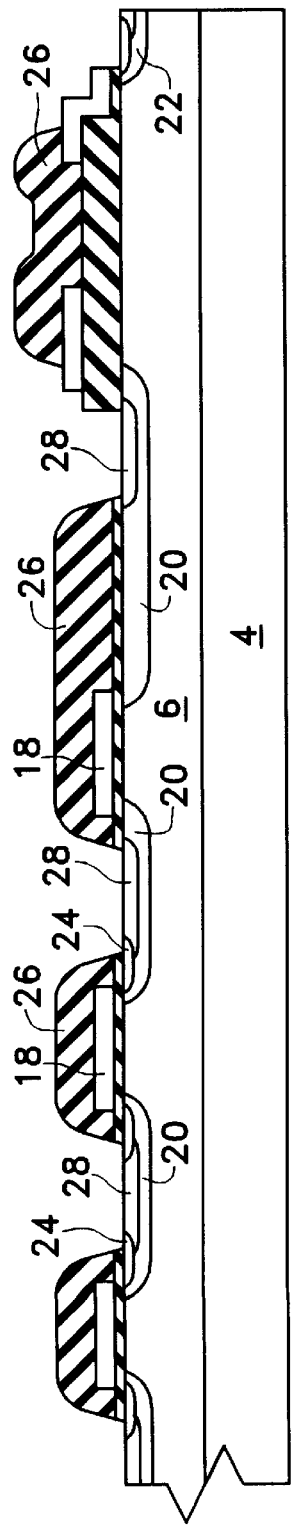
Figure 1P:
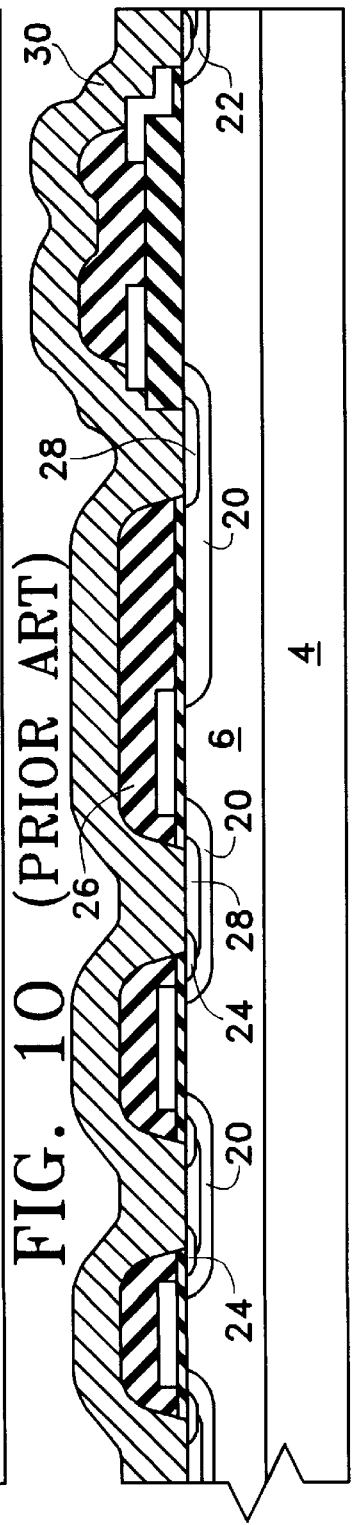
Figure 1Q:
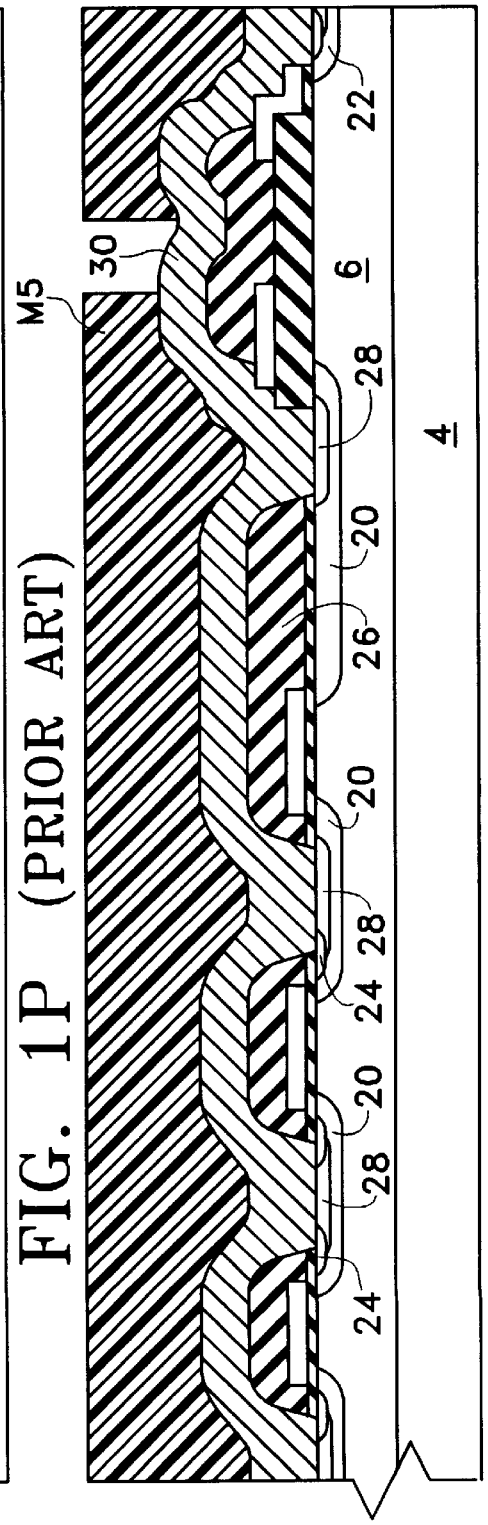
Figure 1R:
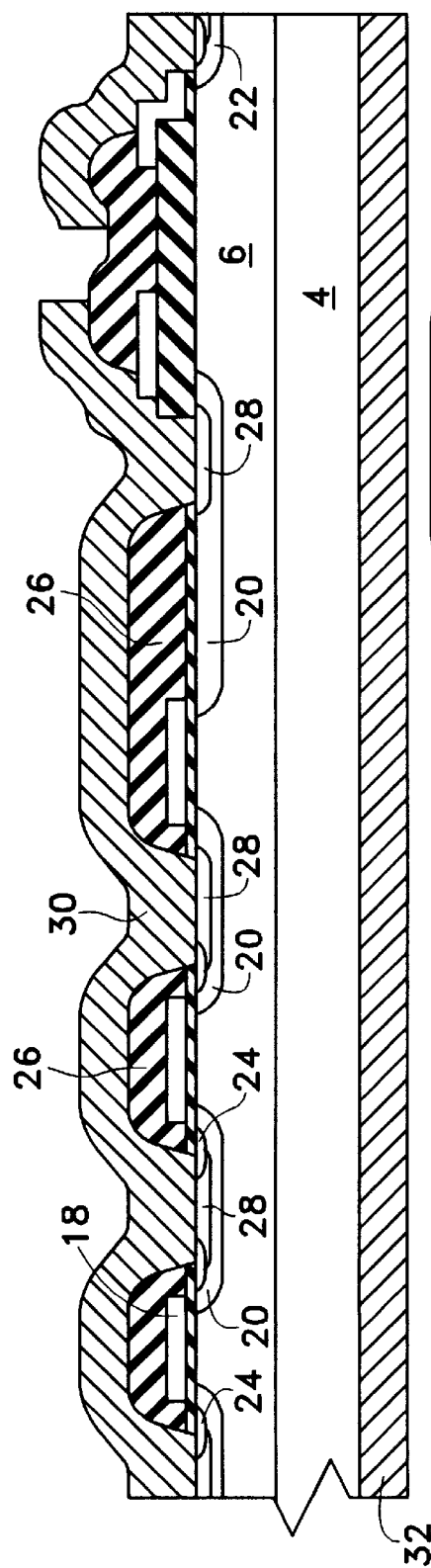

Reference is now made to FIGS. 3A–3S. In the preferred method, the fabrication process starts with providing a n-type silicon wafer 38 with a <1,0,0> crystal orientation and a resistivity of between 0.001 Ω-cm–0.007 Ω-cm, for example, as shown in FIG. 3A. An epitaxial layer 40 with a resistivity of between 0.1 Ω-cm–10 Ω-cm is then grown atop the base wafer 38 to a thickness of about 6 $\mu$m to 10 $\mu$m. Up to this step, the resultant structure with a planar surface 9 is as shown in FIG. 3B. A gate oxide layer 42 is then thermally grown atop the epitaxial layer 40 under an ambient temperature of between 900° C.–1,100° C. to a thickness of approximately 200 Å–1,000 Å as shown in FIG. 3C.

A gate layer 44 is thereafter deposited atop the gate oxide layer 42 as shown in FIG. 3D. In this method, the gate layer 44 is formed of polycrystalline silicon and is deposited by the method of chemical vapor deposition (CVD).

The gate layer 44 needs to be patterned. A photoresist mask MI, called the polymask, is first spun atop the gate layer 44. Conventional techniques of masking and etching are employed to selectively open windows 46 in the photoresist mask MI. The resultant structure up to this step is shown in FIG. 3E.

Using the patterned photoresist mask MI as a shielding mask, the structure is then subjected to the standard technique of either dry or wet etch. In the preferred method, the dry etch process is used in which the etchant is plasma. Windows 46 in the photoresist mask MI are accordingly transferred to the gate layer 44 as a plurality of gate segments 48 separated by spacings 50. The resultant structure up to this step is shown in FIG. 3F.

The structure is then covered with an oxide layer 52 to a thickness of approximately 1,000 Å–7,000 Å, as shown in FIG. 3G. Thereafter, another layer of photoresist mask MII, called the active mask, is laid atop the oxide layer 52. After patterning, the resultant structure is shown in FIG. 3H.

Relying on the photoresist mask MII as a shielding mask, the oxide layer 52 is patterned via the technique of reactive ion beam (RIB) etching. The etchant used is energized plasma which significantly attacks the oxide layer 52 much faster than the photoresist mask MII. Moreover, the gate layer 48 made of polycrystalline silicon is also substantially immune from plasma attack. Thereafter, the photoresist mask MII is removed with the use of a photoresist solvent. The resultant structure up to this step is shown in FIG. 3I.

It should be noted that after the plasma etching step, portions of the oxide layer 52 cling to the boundaries of the gate segments 48 to form a spacer layer 54, as shown in FIG. 3I. This is due to the "shadowing" effect of the gate segments 48 in shielding the etching plasma during the RIB etching process. The spacer layer 54 serves a very important function which will be explained later in this specification.

The patterned oxide layer 52 formed in the spacings 50 of the gate layer 48 results in a combination mask 56 with a plurality of windows 57. Relying on the combination mask 56 as a shield, p-type material, such as boron (B), is ion-implanted into the planar surface 9 through the windows 57 under an implant potential of between 30 KeV to 100 KeV at a dosage of approximately $3\times10^{13}$ cm$^{-2}$ to $3\times10^{14}$ cm$^{-2}$, as shown in FIG. 3J. The implanted boron 58 stays at the planar surface 9 in each window 57. The structure then undergoes a diffusion cycle at a temperature range of approximately 1,000° C.–1,200° C., for a time duration of between 10 minutes to 2 hours to a junction depth of approximately 1$\mu$ to 2$\mu$. The implanted ions 58 in each window 57 diffuses radially in the epitaxial layer 40 in a downward and sideward direction 60 as shown in FIG. 3J. In this specification and in the appended claims, the word "downward" is construed as away from the planar surface 9 toward the semiconductor substrate. After the diffusion cycle, selected portions of the diffused boron merge together to form a body layer with a plurality of body regions 62 as shown in FIG. 3K.

Using the same combination mask 56 as a masking layer, the structure is then subjected to another ion implantation process. This time the implant ions are of the n-type conductivity. Exemplary implant material can be either arsenic (As) or phosphorus (P). The implant potential can be set at 60 KeV to 150 KeV at a dosage range of between $5\times10^{15}$ cm$^{-2}$ to $1\times10^{16}$ cm$^{-2}$, as shown in FIG. 3L. After a proper diffusion cycle, the resultant structure up to this step with a plurality of source diffusion regions 64 is shown in FIG. 3M.

What follows is the step of depositing a passivation layer 66 on the top of the planar surface 9 to a thickness of approximately 5,000 Å to 15,000 Å, via the CVD method. The material for the passivation layer can be phosphosilicate glass (PSG). The passivation layer 66 is then subjected a densification process under a temperature range of about 900° C.–950° C. for 30 minutes to 60 minutes. A third photoresist mask MIII, called the contact mask, is patterned on the top of the passivation layer 66 as shown in FIG. 3N.

The passivation oxide layer 66 is then etched through the patterned mask MIII using an etchant which significantly attacks the passivation oxide layer 66 but not the patterned photoresist mask MIII. Either the method of dry etch or wet etch can be employed. If the dry etch method is used, the etchant is plasma. If the wet etch method is adopted, the etchant can be HF. Thereafter, the mask MIII is removed, the resultant structure up to this step is shown in FIG. 3O.

Using the patterned passivation layer 66 as a shielding mask, boron is then implanted into the body layer 62 for the formation of the contact layer 68 which is of the p-type conductivity. The implant potential can be positioned between 30 to 80 KeV and the implant dosage can be set at approximately $1\times10^{15}$ cm$^{-2}$. After a proper drive-in cycle, the contact layer 68 is formed as shown in FIG. 3P.

A metal layer 70 is thereafter deposited on the top of the planar surface 9 covering the passivation layer 66 by the sputtering method. In the preferred method, the material for the metal layer 70 is aluminum (Al) which is deposited to a thickness of approximately 4$\mu$. A fourth mask MIV, called the metal mask, is then laid atop the metal layer 70. After proper patterning, the resultant structure up to this step is shown in FIG. 3R. The metal layer 70 is then selectively etched via the metal mask MIV. Finally, a drain metal layer 72 is deposited onto the bottom side of the silicon wafer 38 as shown in FIG. 3R. The photoresist mask MIV is then removed. The resultant structure up to this step is shown in FIG. 3S.

Not shown in FIGS. 3A–3S is the deposition of another masking step via a 5th mask MV, called the bonding pad mask, to selectively expose the metal layer 70 for the attachment of bonding wires after a top protective insulating layer is deposited over the structure.

Reference is now referred back to FIG. 3E. By virtue of relying on the mask MI to perform the triple functions of preliminarily defining an active circuit region 74 remote from the scribe line 14; of acting as a template shield for the patterning of the gate segments 48; and of acting as part of the combination mask 56 for the subsequent source and body regions diffusions, a mask with a substantial number of processing steps are eliminated as compared to the prior art method as described previously. Specifically, excluding the bonding pad masks, the conventional fabrication process requires five masks, namely M1–M5 as shown in FIGS.

1A–1R. As a comparison, the method of the invention needs only four masks, namely, MI–MIV to accomplish the same as shown in FIGS. 3A–3S. As mentioned before, the consequential benefits are substantial. There is first the reduction of manufacturing costs due to the eliminated mask and the various patterning and etching steps associated with the mask. Moreover, there is a significantly reduced chance of contaminating the structure during fabrication and consequently providing higher production yield.

Figure 2:
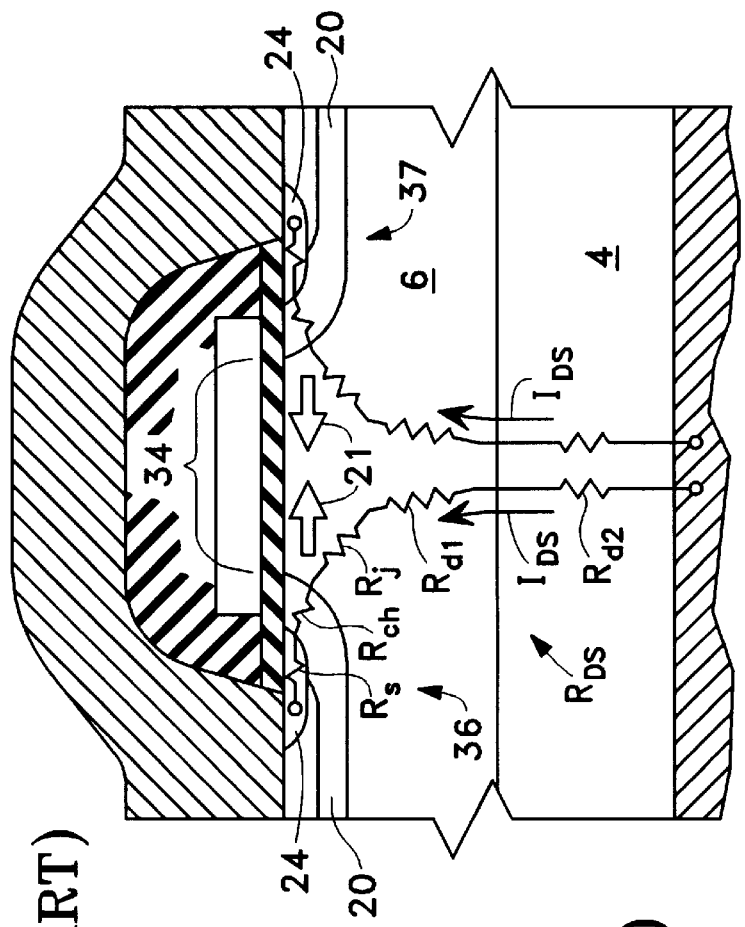
FIG. 2 is a cross-sectional view showing the constituent components of the on-state drain-to-source resistance of a MOSFET cell.

Equally as important, the optimal sequence of laying down the gate mask MI prior to the patterning of the active layer mask MII provide the additional benefit of securing a spacer layer 54 attached to the boundaries of the gate segments 48 (FIG. 3S). First, encroachments due to the unavoidable side diffusion of the diffusion regions, such as the body regions 62 and the source regions 64, among cells are alleviated. The spacer layer 54 practically separates the diffusion regions farther apart among cells, in contrast with the prior art method as shown in FIG. 2. With the method of the invention, theoretically, the geometrical dimensions of each component can be as small as the technology of photolithograpy allows. Should a wider spacing effect required of the spacer layer 54, the gate layer 48 can simply be deposited to a larger thickness, thereby increasing the "shadowing" effect under the RIB etching process.

Alternatively, the structure can be built with no spacer layer 54. For example, in the fabrication of power MOSFET devices requiring high break down voltages, there may be no need for high density integration. To save costs in fabrication, instead of using RIB etching, the conventional wet etch method can be used (see FIGS. 3H and 3I). The wet etchant used can be hydrofluoric acid (HF) which is pervasive and provides minimal shadowing effect during etching. The resultant structure using the wet etching method eliminating the spacer layer 54 is shown in FIG. 4.

Figure 5A:
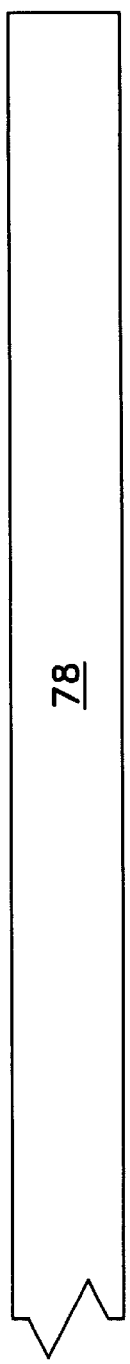
FIGS. 5A–5S, are sequential views schematically illustrating the second method of fabricating a trenched MOSFET structure of the invention.
Figure 5B:
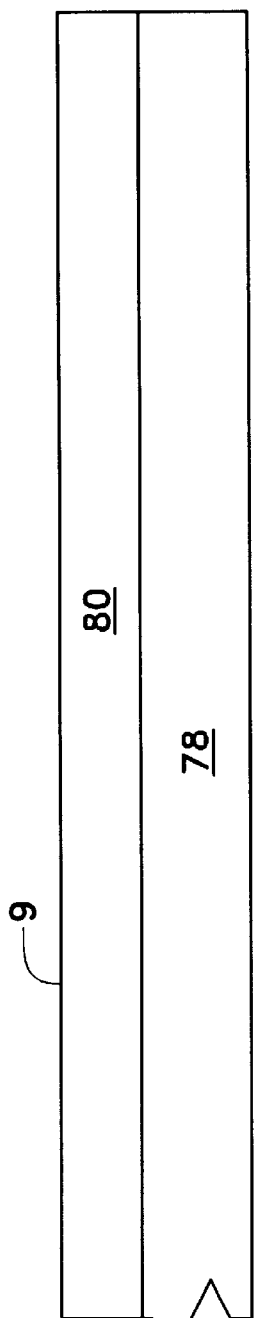
Figure 5C:
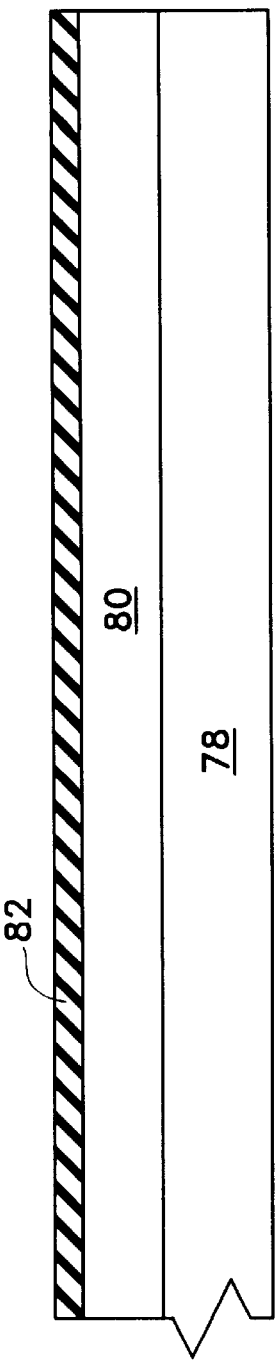
Figure 5D:
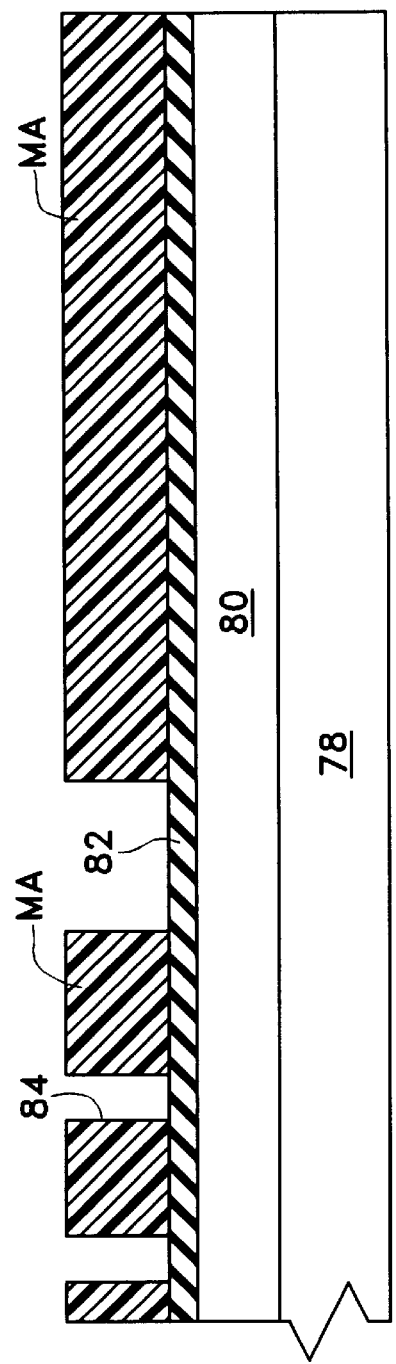
Figure 5E:
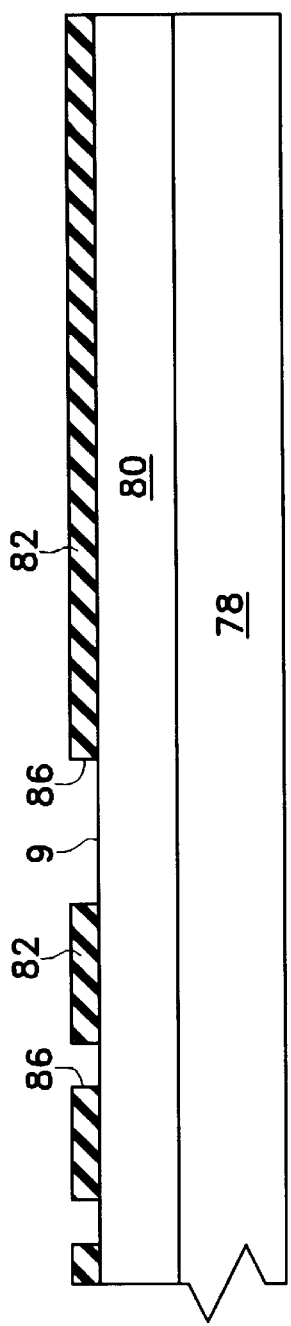
Figure 5F:
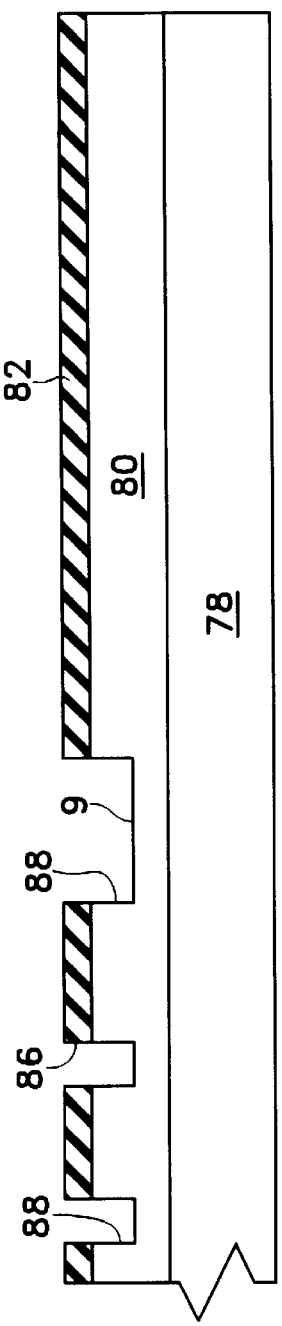
Figure 5G:
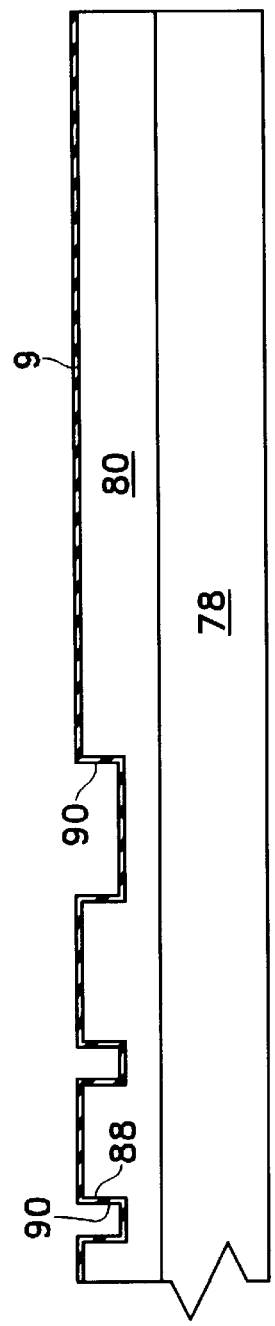
Figure 5H:
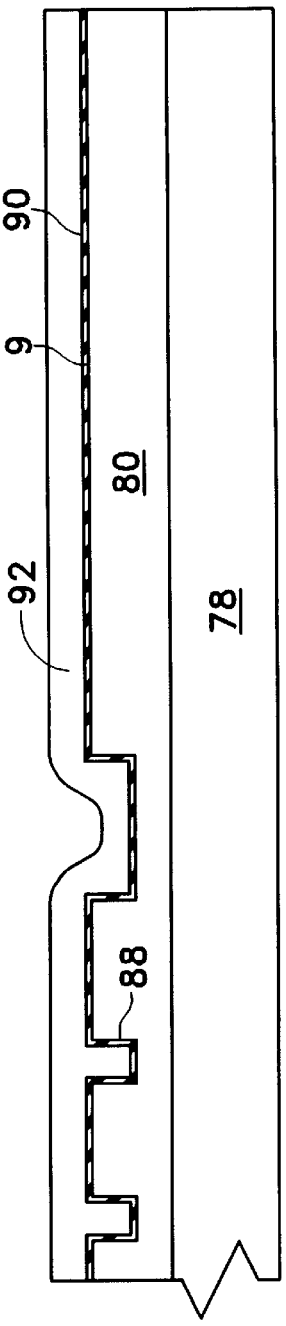
Figure 5L:
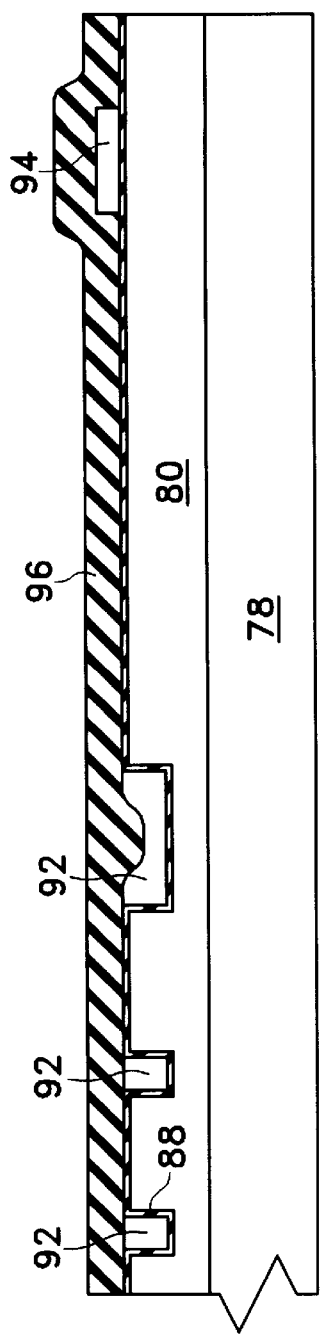
Figure 5M:
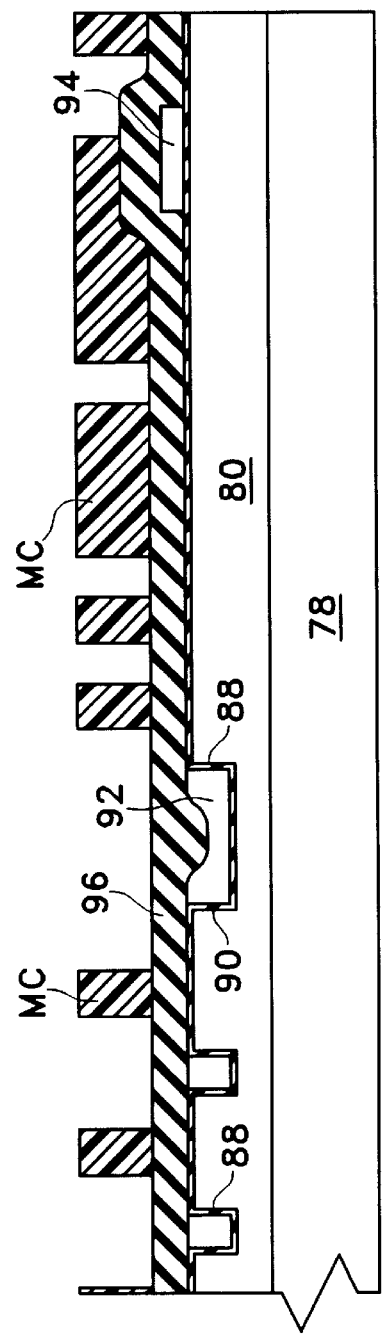
Figure 5N:
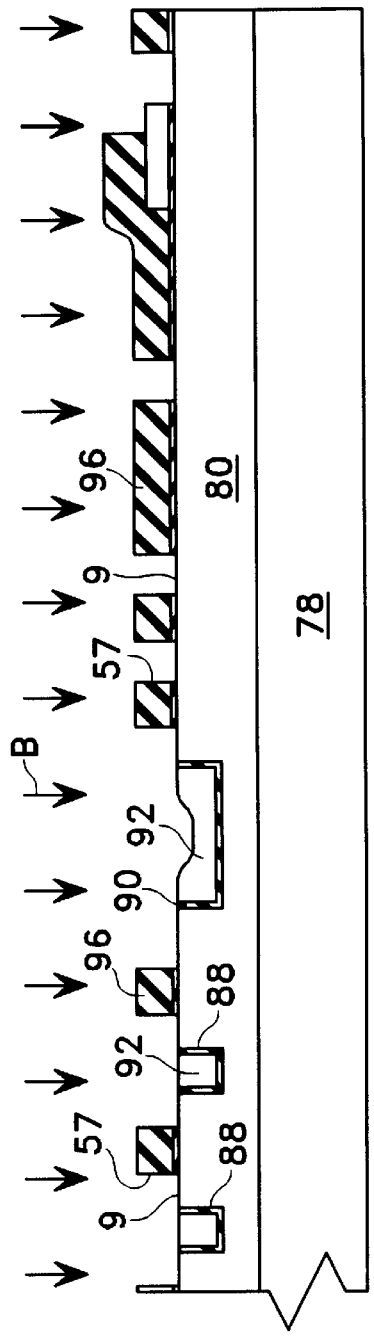
Figure 5O:
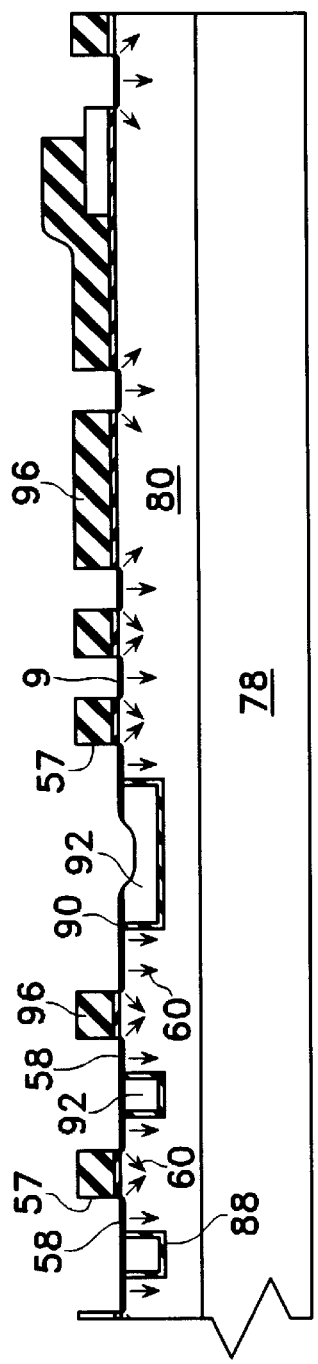
Figure 5P:
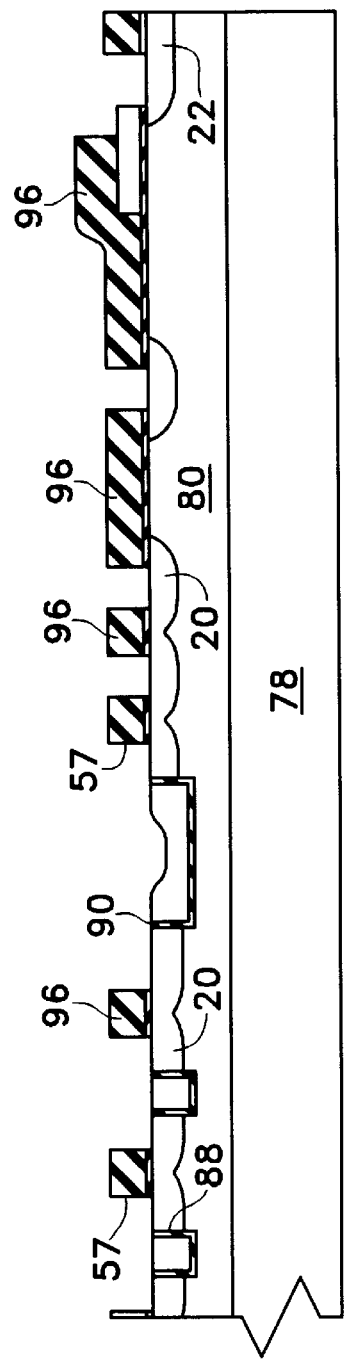
Figure 5Q:
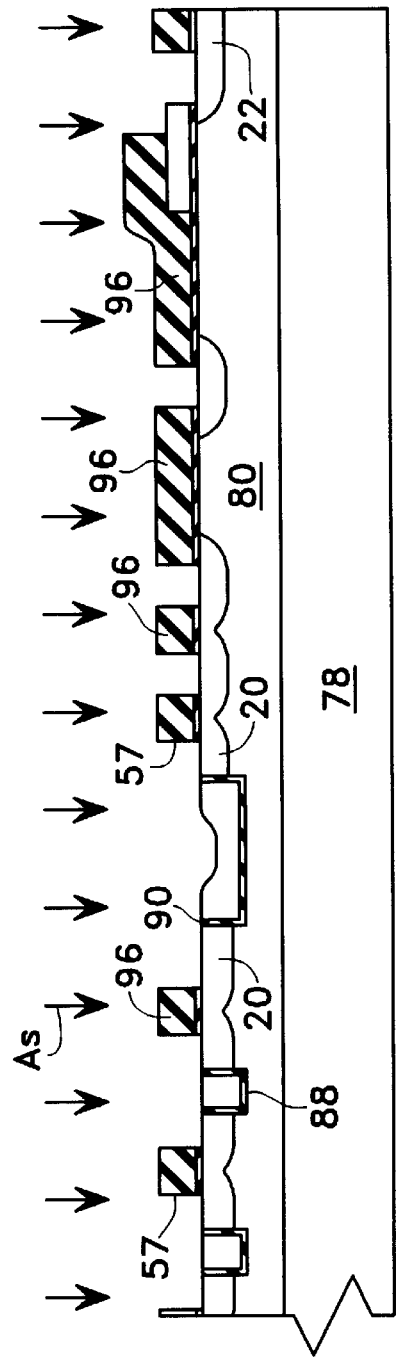
Figure 5R:
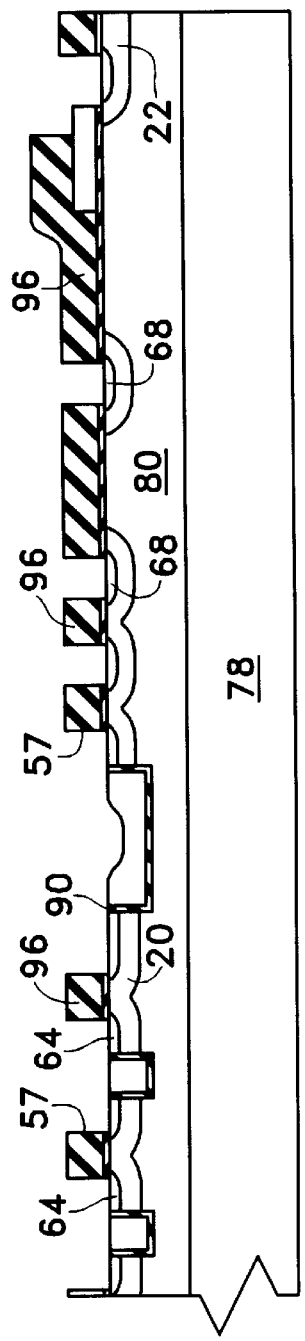
Figure 5S:
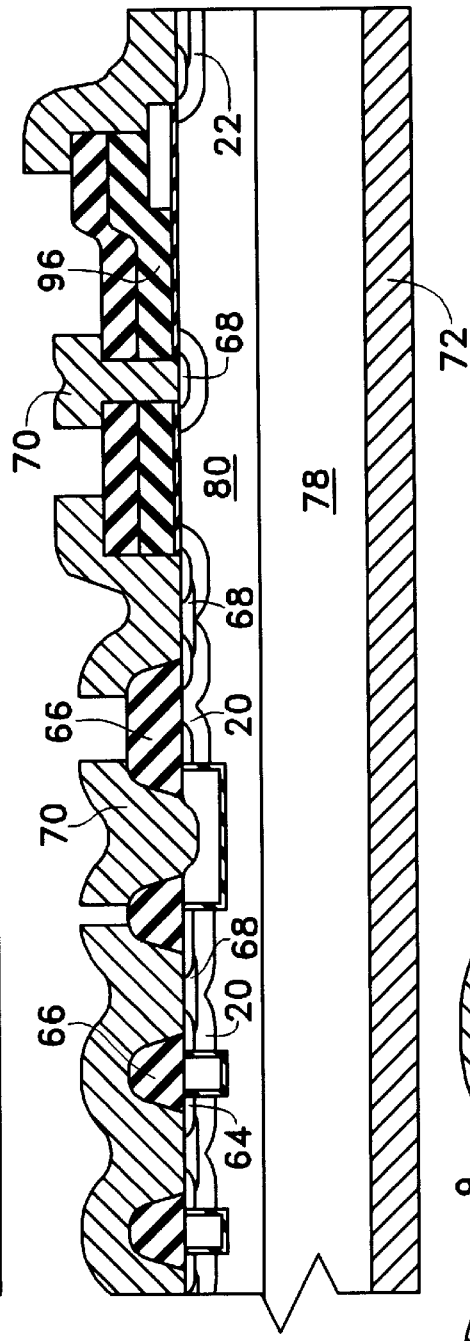

FIGS. 5A–5S show the second method of the invention for fabricating a trenched gate MOSFET device. As with the first method, the fabrication process starts with providing a n-type silicon wafer 78 with a <1,0,0> crystal orientation and a resistivity of between 0.001 Ω-cm–0.007 Ω-cm, for example, as shown in FIG. 5A. An epitaxial layer 80 with a resistivity of approximately between 0.1 Ω-cm–2.0 Ω-cm is then grown atop the base wafer 78 to a thickness of about 3 μm to 20 μm as shown in FIG. 5B. An oxide layer 82 is thereafter grown on the top of the expitaxial layer 80 under an ambient temperature of between 900° C. –1,100° C. to a thickness of approximately 1,000–8,000 Å as shown in FIG. 5C.

The oxide layer 82 needs to be patterned. A photoresist layer MA is first spun atop the oxide layer 82. Conventional techniques of masking and etching are employed to pattern selectively open windows 84 in the photoresist layer MA. The patterned photoresist layer MA is called the trench mask. The windows 84 are relied on for the formation of trenches which will be explained later. The resultant structure up to this step is as shown in FIG. 5D.

Using the patterned photoresist mask MA as a shielding mask, the structure is then subjected to the standard technique of either dry or wet etch. In the preferred method, the dry etch process is used, in which the etchant is plasma. Should the wet etch method be preferred, HF can be used as etchant. Either the dry or wet etchant attacks the oxide layer 82 but not the photoresist mask MA. Windows 84 in the photoresist MI is then transferred to the oxide layer 82 as windows 86 as shown in FIG. 5E.

The structure then undergoes the technique of dry anisotropic etching by exposing the structure to an energized plasma (not shown) for the formation of trenches 88 as shown in FIG. 5F.

The oxide layer 82 is then removed. What follows is the step of forming a gate oxide layer by lining the trenches 88 with insulating material. First, the trenches 88 have to undergo a sacrificial oxidation process. Basically, the structure is exposed to an oxidation agent of either oxygen ($O_2$), if the dry method is employed, or steam ($H_2O$), if the wet method is preferred, under an ambient temperature of approximately between 900° C.–1,100° C. The grown sacrificial oxide layer (not shown) is then lightly etched away for the purpose of securing a smooth silicon surface in the trenches 88 as a prelude for subsequent gate oxide growth. The method of wet etch can be applied for the removal of the sacrificial oxide layer (not shown). The step of gate oxide growth is then carried out by exposing the structure to either dry or wet agents as described above, under an ambient temperature of between 900° C.–1,100° C. to a thickness of approximately 300 Å–2,000 Å. The resultant structure with a grown gate oxide layer 64 is shown in FIG. 5G.

The trenches 88 need to be filled with conductive material. In this method, the trenches 88 are filled with polycrystalline silicon 90 by the conventional method of chemical vapor deposition (CVD) to a thickness of approximately 1.5 μm to 3.0 μm above the planar surface 9. The step of either mechanical or chemical planarization then follows. In this method, the dry etch technique is used. The plasma etches away the polycrystalline silicon 92 to a thickness of approximately 1,000 Å–2,500 Å above the planar surface 9. The resultant structure up to this step is shown in FIG. 5I. The remaining polycrystalline silicon 92 is then doped with phosphorus oxychloride ($POCl_3$) to a sheet resistivity of approximately 10 Ω/☐–40 Ω/☐ under an ambient temperature of about 950° C.

A second photoresist mask MB, called the poly mask, is patterned atop the polycrystalline silicon 92 as shown in FIG. 5J. Using the patterned photoresist mask MB as a shielding mask, the structure is then subjected to the standard technique of either dry or wet etch. In this method, the dry etch process is used. After etching, the polycrystalline silicon layer 92 is further planarized. In addition, polycrystalline segments 94 as part of the termination circuit region 76 are formed above the planar surface 9 as shown in FIG. 5K.

The structure is then covered with an oxide layer 96 to a thickness of approximately 1,000 Å–7,000 Å. Thereafter, another layer of photoresist mask MC, called the active mask, is laid atop the oxide layer 96. After patterning, the resultant structure up to this step is shown in FIG. 5M.

Relying on the photoresist mask MC as a shielding mask, the oxide layer 96 is patterned via the technique of RIB etching. The etchant used is plasma which significantly attacks the oxide layer 96 much faster than the photoresist mask MC. Morever, the polycrystalline silicon layer 92 is also substantially resistant to the plasma etch. As an alternative, the wet etching method can also be sued as a substitute. The wet etchant can be HF. After etching, the photoresist mask MC is removed. The resultant structure up to this step is shown in FIG. 5N Relying on the oxide layer 96 as a shield, p-type material, such as boron (B), is ion-implanted onto the planar surface 9 through the windows 57 of the oxide layer 96 under an implant potential of between 30 KeV to 100 KeV at a dosage of approximately $3\times10^{13}$ cm$^{-2}$ to $3\times10^{14}$ cm$^{-2}$, as shown in FIG. 5N. The implanted boron 58 stays at the planar surface 9 in each window 57. The structure then undergoes a diffusion cycle at a temperature range of approximately 1,000° C.–1,200° C., for a time duration of between 10 minutes to 2 hours to a junction depth of approximately $1\mu$ to $2\mu$. The implanted ions 58 in each window 57 diffuses radially in the epitaxial layer 80 in the direction 60 as shown in FIG. 5O. After the diffusion cycle, selected portions of the diffused boron merge together to form a body layer with a plurality of body regions 20.

Again, using the oxide layer 96 as a shielding mask, the structure is then subjected to another ion implantation process. This time the implant ions are of the n-type conductivity. The implant material can be either be arsenic (As) or phosphorus (P). The implant potential can be set at 60 KeV to 250 KeV at a dosage range of between $5 \times 10^{15}$ cm$^{-2}$ to $1 \times 10^{16}$ cm$^{-2}$, as shown in FIG. 5Q. After a proper diffusion cycle, the resultant structure up to this step with a plurality of source diffusion regions 64 is shown in FIG. 5R.

What follows is the step of depositing and patterning a passivation layer 66 and the step of matelization by patterning a metal layer 70 above the passivation layer 66. The step of patterning the passivation layer 66 requires a fourth mask MD, called the contact mask. The step of matelization involve another mask ME. These steps are substantially similar to the corresponding steps in the first method as described above. For the sake of conciseness, the steps that follow are not further elaborated.

Figure 6:
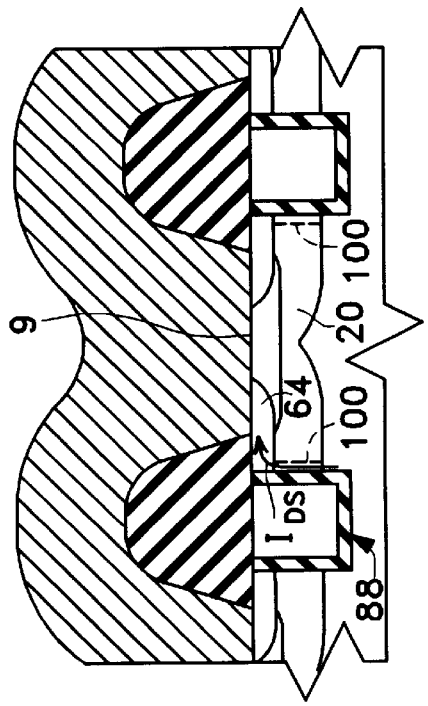
FIG. 6 is a cross-sectional side view of a trenched gate cell formed by the method shown in FIGS. 5A–5S illustrating the effect a vertical channel which allows high density integration via high resolution photolithography.

Excluding the bonding pad mask, the method of the invention for fabricating a trenched gate MOSFET device requires only five masks, namely, MA–ME, in contrast with any comparable prior art method which normally demands six masks. Furthermore, it should be noted that theoretically, there is no limitation placed on the lateral dimension for the trenched gate MOSFET device. The reason is that in a trenched gate MOSFET device, the channel of each cell is positioned in a vertical manner with respect to the planar surface 9 as shown in FIG. 6. During the on-state, the drain-to-source current $I_{DS}$ directly flows through the vertical channel 100, which is highly conductive when it is turned on. Thus, cell-to-cell encroachment which undercuts the source-to-drain resistance $R_{DS}$ does not exist as compared to the planar counterpart. Accordingly, there is no need to build any spacer layer, such as the layer 54 shown in FIG. 3S.

Finally, other changes are possible within the scope of the invention. For example, the contact regions 68 need not be present in the structure. Without the contact region 68, the resultant structure may lack robustness in performance, but is nevertheless a functional trenched gate MOSFET. Moreover, the conductivity types of the layers may very well be different from that as depicted in the specification. In addition, the device fabricated in accordance with the invention need not be a power MOSFET. It can well be used for other purposes, such as a dynamic random access memory (DRAM) cell, or a charge-coupled-device (CCD), to name just a few. It will be understood by those skilled in the art that these and other changes in form and detail may be made therein without departing from the scope and spirit of the invention.

What is claimed is:

1. A method of forming a semiconductor structure, comprising the steps of:
    (a) providing a substrate of a first conductivity type, said substrate includes a major surface;
    (b) patterning a gate layer over said major surface, said gate layer includes a plurality of gate segments separated by a plurality of spacings;
    (c) patterning a masking layer in said plurality of spacings and over said substrate by depositing a layer of masking material over said substrate and thereafter selectively etching said layer of masking material such that some portions of said masking material remain in said spacings of said gate layer and other portions of said masking material attach to the boundaries of said plurality of gate segments to form a spacer layer;
    (d) depositing material of a second conductivity type on said substrate through said gate and masking layers; and
    (e) diffusing material of said second conductivity type in said substrate sidewardly and downwardly under said gate and masking layers.

2. The method of forming a semiconductor structure as set forth in claim 1 wherein step (e) includes diffusing material of said second conductivity type in said substrate sidewardly and downwardly so as to merge preselected portions of the material of said second conductivity type under said gate and masking layers together.

3. The method of forming a semiconductor structure as set forth in claim 1 wherein step (c) includes selectively etching said layer of masking material using a plasma.

4. The method of forming a semiconductor structure as set forth in claim 1 wherein step (c) include depositing a layer of silicon dioxide over said substrate, and selectively etching said layer of silicon dioxide using a plasma.

5. The method of forming a semiconductor structure as set forth in claim 1 further includes depositing material of said first conductivity type in said substrate through said gate, masking and spacer layers.

6. The method of forming a semiconductor structure as set forth in claim 1 wherein gate layer is formed of polycrystalline silicon and said masking layer is formed of silicon dioxide.

7. The method of forming a semiconductor structure as set forth in claim 1 wherein step (b) includes the substeps of:
    (i) depositing a gate oxide layer over said major surface;
    (ii) depositing a gate layer over said gate oxide layer;
    (iii) patterning a photoresist layer over said gate layer; and
    (iv) etching said gate layer through said photoresist layer to form said plurality of gate segments separated by said plurality of spacings.

8. A method of forming a semiconductor structure, comprising the sequential steps of:
    (a) providing a semiconductor substrate of a first conductivity type, said substrate having a major surface;
    (b) depositing a gate oxide layer on said semiconductor substrate;
    (c) depositing a layer of polycrystalline silicon on said gate oxide layer;
    (d) forming a gate layer by patterning said layer of polycrystalline silicon, said gate layer includes a plurality of gate segments separated by a plurality of spacings;
    (e) depositing a masking layer over said gate layer and gate oxide layer;
    (f) patterning said masking and gate oxide layers such that some portions of said masking and gate oxide layers remain in the spacings of said gate layer, and other portions of said masking and gate oxide layers attach to the boundaries of said plurality of gate segments to form a spacer layer, thereby forming a combination mask with said gate segments of said gate layer;
    (g) depositing material of a second conductivity type on said substrate through said combination mask; and (h) diffusing material of said second conductivity type in said substrate downwardly and sidewardly so as to merge selected portions of the material of said second conductivity type together to form a plurality of body regions;

(i) forming a source layer by depositing material of said first conductivity type in said substrate through said combination mask;

(j) removing said masking layer;

(k) patterning an insulating layer over said major surface; and (l) providing electrical connections to said source and gate layers by patterning a conductive layer over said insulating layer.

9. The method of forming a semiconductor structure as set forth in claim 8 wherein step (f) includes the substeps of:

(i) laying a photoresist layer above said masking layer;

(ii) patterning said photoresist layer; and (iii) selectively etching said masking layer and gate oxide layer through said photoresist layer using a plasma such that portions of said masking and gate oxide layer attach to the boundaries of said gate segments to form a spacer layer.

10. A method of forming an array of field-effect transistors, said method comprising the sequential steps of:

(a) providing a substrate with a first conductivity type, said substrate including a major surface;

(b) forming a plurality of gates proximal to said major surface, said plurality of gates being separated by a plurality of spacings;

(c) patterning a masking layer in said plurality of spacings over said substrate by depositing a layer of masking material over said substrate and thereafter selectively etching said layer of masking material such that some portions of said masking material remain in said spacings of said gates and other portions of said masking material attach to the boundaries of said gates to form a spacer layer.

(d) depositing material of a second conductivity type on said substrate; and (e) diffusing material of said second conductivity type in said substrate sidewardly and downwardly so as to merge preselected portions of the material of said second conductivity in said substrate under said major surface together.

11. The method of forming an array of field-effect transistors as set forth in claim 10 wherein step (b) includes the substeps of:

(i) depositing a gate layer over said gate oxide layer;

(ii) patterning a photoresist layer over said gate layer; and (iii) etching said gate layer through said photoresist layer to form said plurality of gates separated by said plurality of spacings.

12. The method of forming an array of field-effect transistors as set forth in claim 11 further includes depositing material of said first conductivity type in said substrate through said gates and said masking layer.

* * * * *